US009806028B2

(12) United States Patent
Lee et al.

(10) Patent No.: US 9,806,028 B2
(45) Date of Patent: Oct. 31, 2017

(54) SEMICONDUCTOR MEMORY DEVICE

(71) Applicants: Jaekyu Lee, Seongnam-si (KR); Kiseok Suh, Hwaseong-si (KR)

(72) Inventors: Jaekyu Lee, Seongnam-si (KR); Kiseok Suh, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/791,812

(22) Filed: Jul. 6, 2015

(65) Prior Publication Data

US 2016/0086882 A1    Mar. 24, 2016

(30) Foreign Application Priority Data

Sep. 22, 2014   (KR) .......................... 10-2014-0125994

(51) Int. Cl.
| H01L 23/535 | (2006.01) |
| H01L 45/00 | (2006.01) |
| H01L 27/22 | (2006.01) |
| H01L 27/24 | (2006.01) |
| H01L 27/108 | (2006.01) |

(52) U.S. Cl.
CPC .......... *H01L 23/535* (2013.01); *H01L 27/228* (2013.01); *H01L 27/2436* (2013.01); *H01L 27/2463* (2013.01); *H01L 45/04* (2013.01); *H01L 45/06* (2013.01); *H01L 45/1233* (2013.01); *H01L 45/144* (2013.01); *H01L 45/146* (2013.01); *H01L 45/147* (2013.01); *H01L 27/10855* (2013.01); *H01L 27/10876* (2013.01); *H01L 27/10885* (2013.01); *H01L 2924/0002* (2013.01)

(58) Field of Classification Search
CPC . H01L 23/535; H01L 45/146; H01L 27/2436; H01L 45/147; H01L 45/1233; H01L 45/04; H01L 27/2463; H01L 45/144; H01L 45/06; H01L 27/228; H01L 27/10876; H01L 27/10885; H01L 27/10855
USPC ........................................................ 257/773
See application file for complete search history.

(56) References Cited

U.S. PATENT DOCUMENTS

| 6,542,398 B2 | 4/2003 | Kang et al. |
| 7,019,370 B2 | 3/2006 | Cha |
| 7,195,929 B2 | 3/2007 | Park et al. |
| 7,321,508 B2 | 1/2008 | Motoyoshi |

(Continued)

*Primary Examiner* — Fernando L Toledo
*Assistant Examiner* — Adam S Bowen
(74) *Attorney, Agent, or Firm* — Harness, Dickey & Pierce, P.L.C.

(57) ABSTRACT

A semiconductor memory device includes a device isolation in a trench that defines first to third active patterns that are spaced apart from each other and having a long axis parallel to a first direction, first and second word lines extending in a second direction perpendicular to the first direction, a bit line, and a source line. The first and second active patterns are arranged in the second direction to constitute a column. The third active pattern is at a side of the column. The first word line intersects the first and second active patterns. The second word line intersects the third active pattern. When viewed from a plan view, the bit line extends in the first direction between the first and third active patterns, and the source line extends in the first direction between the second and third active patterns.

20 Claims, 41 Drawing Sheets

(56) References Cited

U.S. PATENT DOCUMENTS

| | | | |
|---|---|---|---|
| 7,542,326 B2 * | 6/2009 | Yoshimura | G11C 11/22 365/148 |
| 7,745,894 B2 | 6/2010 | Asao et al. | |
| 7,990,752 B2 | 8/2011 | Asao | |
| 8,202,737 B2 | 6/2012 | Kim | |
| 8,558,297 B2 | 10/2013 | Liaw et al. | |
| 2013/0141965 A1 * | 6/2013 | Lee | G11C 8/10 365/158 |
| 2013/0153998 A1 * | 6/2013 | Song | H01L 27/228 257/334 |
| 2013/0235656 A1 | 9/2013 | Li et al. | |

* cited by examiner

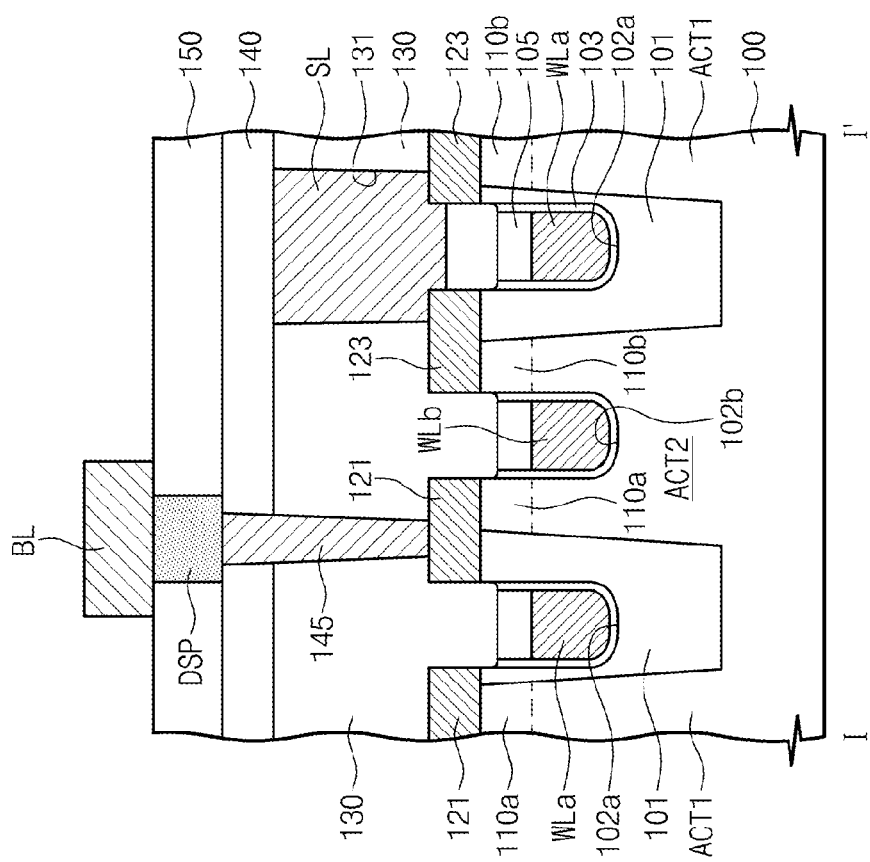

SEMICONDUCTOR MEMORY DEVICE

CROSS-REFERENCE TO RELATED APPLICATION

This U.S. non-provisional patent application claims priority under 35 U.S.C. §119 to Korean Patent Application No. 10-2014-0125994, filed on Sep. 22, 2014, in the Korean Intellectual Property Office, the disclosure of which is hereby incorporated by reference in its entirety.

BACKGROUND

Inventive concepts relate to a semiconductor memory device. More particularly, inventive concepts relate to a semiconductor memory device including variable resistance elements.

Semiconductor devices are widely used in the electronic industry because of their small sizes, multi-functional characteristics, and low manufacturing costs. Semiconductor devices may be categorized as any one of semiconductor memory devices storing logical data, semiconductor logic devices performing operations of logical data, or system-on-chips having both the function of the semiconductor memory device and the function of the semiconductor logic device.

As semiconductor devices have become more integrated with the development of the electronic industry, margins of manufacturing processes may be reduced and resistances of memory cells of semiconductor memory devices may be increased.

SUMMARY

Example embodiments relate to a semiconductor memory device capable of improving an integration density and reliability.

According to example embodiments, a semiconductor memory device may include a semiconductor substrate including a trench that defines first, second and third active patterns spaced apart from each other, a device isolation layer, a first word line, a second word line, a bit line, and a source line. Each of the first, second, and third active patterns have a long axis parallel to a first direction perpendicular to a second direction. Each of the first, second, and third active patterns include first and second dopant regions. The first and second active patterns are arranged in the second direction to constitute a column. The third active pattern is at a side of the column. The device isolation layer is in the trench. The device isolation layer exposes the first, second, and third active patterns. The first word line extends in the second direction. The first word line intersects the first and second active patterns. The second word line extends in the second direction. The second word line intersects the third active pattern. The first and second dopant regions in each of the first and second active patterns are at both sides of the first word line, respectively. The first and second dopant regions in the third active pattern are at both sides of the second word line respectively. The bit line extends in the first direction and between the first active pattern and the third active pattern when viewed from a plan view. The bit line is connected to the first dopant regions of the first and third active patterns. The source line extends in the second direction between the second active pattern and the third active pattern when viewed from the plan view. The source line is connected to the second dopant regions of the second and third active patterns.

In example embodiments, the first word line may be spaced apart from the third active pattern, and the second word line may be spaced apart from the first and second active patterns.

In example embodiments, a height at which the bit line is disposed from the semiconductor substrate may be different from a height at which the source line is disposed from the semiconductor substrate.

In example embodiments, the device may further include a first conductive pad that is in contact with a portion of each of the first dopant regions, and a second conductive pad that is in contact with a portion of each of the second dopant regions. The first and second conductive pads connected to the third active pattern may be arranged in a first diagonal direction that is different from a second diagonal direction with respect to the long axis of the first active pattern. The first and second conductive pads may be arranged in the second diagonal direction.

In example embodiments, a top surface of a portion of the device isolation layer may be lower than bottom surfaces of the first and second conductive pads.

In example embodiments, the first and second conductive pads may contact portions of the device isolation layer, respectively.

In example embodiments, the source line may be in direct contact with portions of the second conductive pads arranged along the first direction.

In example embodiments, the device may further include contact plugs connected to the first conductive pads, respectively, and data storing patterns connected between the bit line and the contact plugs.

In example embodiments, the device may further include: contact plugs connected to the first dopant regions, respectively, and conductive pads that contact portions of the second dopant regions, respectively. The source line may be connected in common to the conductive pads on the second and third active patterns.

In example embodiments, the semiconductor memory device may further include contact plugs connected to the first dopant regions, respectively, and a connection pad on the second dopant regions of the second and third active patterns. The second dopant regions of the second and third active patterns may be adjacent to each other in the second direction.

In example embodiments, the source line may be in direct contact with a portion of the connection pad between the second and third active patterns.

According to example embodiments, a semiconductor memory device may include: a semiconductor substrate including a trench, the trench defining an active pattern having a long axis parallel to a first direction; a device isolation layer in the trench; a word line extending in a second direction perpendicular to the first direction, the word line intersecting the active pattern; a first conductive pad at a side of the word line, the first conductive pad being in contact with a portion of the active pattern; a second conductive pad at another side of the word line, the second conductive pad being in contact with another portion of the active pattern; a first conductive line extending in the first direction, the first conductive line being connected to the first conductive pad; and a second conductive line extending in the first direction, the second conductive line being connected to the second conductive pad. The active pattern may be between the first conductive line and the second conductive line when viewed from a plan view.

In example embodiments, the first and second conductive pads may be arranged in a direction diagonal to the first and second directions when viewed from the plan view.

In example embodiments, a height of the first conductive line over the substrate may be different from a height of the second conductive line over the substrate.

In example embodiments, the device may further include: a contact plug connected to the first conductive pad, and a data storing pattern connected between the contact plug and the first conductive line.

In example embodiments, a top surface of a portion of the device isolation layer may be lower than bottom surfaces of the first and second conductive pads.

In example embodiments, the second conductive line may contact a portion of a sidewall of the second conductive pad, and the second conductive line may contact a portion of a top surface of the second conductive pad.

According to example embodiments, a semiconductor memory device may include: a semiconductor substrate including a trench that defines a plurality of first active patterns two-dimensionally arranged in a first direction and a second direction and a plurality of second active patterns two-dimensionally arranged in a first direction and a second direction, the second direction being perpendicular to the first direction, the second active patterns respectively spaced apart from the first active patterns in a diagonal direction, and each of the first and second active patterns having a long axis parallel to the first direction that is different than the diagonal direction, each of the first and second active patterns including first and second dopant regions; first word lines extending in the second direction, the first word lines intersecting the first active patterns, the first and second dopant regions in each of the first active patterns being at both sides of the first word lines, respectively; second word lines extending in the second direction, the second word lines intersecting the second active patterns, the first and second dopant regions in each of the second active patterns being at both sides of the second word lines respectively; first bit lines and second bit lines extending in the first direction, each of the first bit lines connected to the first dopant regions of the first active patterns arranged in the first direction, and each of the second bit lines connected to the first dopant regions of the second active patterns arranged in the first direction; and source lines extending in the first direction. Each of the source lines extends between the first and second bit lines that are adjacent to each other when viewed from a plan view. Each of the source lines may be connected to the second dopant regions of the first and second active patterns arranged in a zigzag form along the first direction.

In example embodiments, each row of the first active patterns arranged in the first direction may be between a corresponding one of the first bit lines and a corresponding one of the source lines that are adjacent to the row of active patterns when viewed from the plan view. Each row of the second active patterns arranged in the first direction may be between a corresponding one of the second bit lines and an adjacent one of the sources that are adjacent to the row of second active patterns when viewed from the plan view.

In example embodiments, the first bit lines and the second bit lines may be spaced apart from each other and are alternately arranged along the second direction.

In example embodiments, each of the first word lines may extend between two of the second active patterns that are adjacent to each other in the first direction. Each of the second word lines extends between two of the first active patterns that are adjacent to each other in the first direction.

In example embodiments, the first and second bit lines may be at a different height above the substrate than the source lines.

In example embodiments, the device may further include first conductive pads that contact portions of the first dopant regions, respectively, and second conductive pads that contact portions of the second dopant regions, respectively. The first and second conductive pads on each of the first active patterns may be arranged in a first diagonal direction with respect to the long axis of the first active pattern. The first and second conductive pads on each of the second active patterns may be arranged in a second diagonal direction that is different from the first diagonal direction.

In example embodiments, each of the source lines may be in direct contact with corresponding portions of the second conductive pads arranged in the first direction.

In example embodiments, the device may further include contact plugs connected to the first conductive pads, respectively, and data storing patterns connected between the contact plugs and the first and second bit lines, respectively.

In example embodiments, the device may include contact plugs connected to the first dopant regions, respectively, and conductive pads in contact with portions of the second dopant regions, respectively. Each of the source lines may be connected in common to the conductive pads on the first and second active patterns arranged in the zigzag form along the first direction.

In example embodiments, the device may include data storing patterns connected between the contact plugs and the first or second bit lines. Each of the data storing patterns may be in contact with a portion of corresponding ones of the contact plugs.

In example embodiments, the semiconductor memory device may further include contact plugs connected to the first dopant regions, and a connection pad. The second dopant regions of the first and second active patterns may be adjacent to each other in the second direction. The connection pad may be connected on the second dopant region of one of the first active patterns and the first dopant region of one of the second active patterns that is adjacent to the second dopant region of the one of the first active patterns.

In example embodiments, one of the source lines may directly contact a portion of the connection pad between the one of the first active patterns and the one of the second active pads.

According to example embodiments, a semiconductor device includes a semiconductor substrate including a trench that defines a plurality of first active patterns and a plurality of second active patterns spaced apart from each other and arranged in rows and columns, the columns of first active patterns alternating with the columns of the second active patterns in a first direction, the rows of first active patterns alternating with the rows of second active patterns in a second direction that crosses the first direction; a device isolation layer in the trench, the device isolation layer exposing the plurality of first active patterns and the plurality of second active patterns; a plurality of source lines and a plurality of bit lines extending in the first direction on the substrate, the plurality of source lines and the plurality of bit lines alternating with each other in the second direction and spaced apart from each other; a plurality of data storage elements electrically connected between the bit lines and the substrate, the data storage elements including a first row of data storage elements and a second row of data storage elements that are adjacent to each other and electrically connected to a same one of the bit lines, the data storage elements in the first row of data storage elements connected between the same one of the bit lines and the first active patterns in one of the rows of active patterns, the data storage elements in the second row of data storage elements connected between the same one of the bit lines and the second active patterns in one of the rows of active patterns; and first word lines and second word lines extending in the second direction on the substrate, the first and second word lines alternating with each other in the first direction and spaced apart from each other, the first word lines intersecting at least one of the first active patterns and the second active patterns in a plan view, the second word lines intersecting at least one of the first active patterns and the second active patterns in the plan view.

In example embodiments, the semiconductor memory device may further include a plurality of first conductive pads and a plurality of second conductive pads. The plurality of first active patterns and the plurality of second active patterns may have a long axis parallel to the first direction. The plurality of first active patterns and the plurality of second active patterns may each include first and second dopant regions. Each of the first conductive pads may be electrically connected to a corresponding one of the data storage elements and one of the first dopant regions of a corresponding one of the first and second active patterns. Each of the second conductive pads may be between the source lines and the second dopant regions of the first and second active patterns.

In example embodiments, the semiconductor memory device may further include a plurality of conductive plugs. The plurality of first active patterns and the plurality of second active patterns may each include first and second dopant regions. Each one of the conductive plugs may directly connect a corresponding one of the data storage elements to a corresponding one of the first dopant regions of one of the first and second active patterns.

In example embodiments, the semiconductor memory device may further include a plurality of first connection pads. Each of the first word lines may extend between two of the second active patterns that are adjacent to each other in the first direction. Each of the second word lines may extend between two of the first active patterns that are adjacent to each other in the first direction. The plurality of first active patterns and the plurality of second active patterns may each include first and second dopant regions. Each of the first connection pads may electrically connect a corresponding one of the source lines to the first dopant region of a corresponding one of the second active patterns and the second dopant region of a corresponding one of the first active patterns.

In example embodiments, the first word lines may intersect both the first active patterns and the second active patterns in the plan view, and the second word lines may intersect both the first active patterns and the second active patterns in the plan view.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIGS. 4A, 4B, and 4C are cross-sectional views taken along lines I-I', II-II', and III-III' of FIG. 3, respectively;

FIGS. 13A to 19A are cross-sectional views taken along the line I-I' of FIG. 3 to illustrate a method of manufacturing a semiconductor memory device according to example embodiments of inventive concepts;

FIGS. 13B to 19B are cross-sectional views taken along the line II-II' of FIG. 3 to illustrate a method of manufacturing a semiconductor memory device according to example embodiments of inventive concepts;

FIGS. 13C to 19C are cross-sectional views taken along the line III-III' of FIG. 3 to illustrate a method of manufacturing a semiconductor memory device according to example embodiments of inventive concepts;

DETAILED DESCRIPTION OF THE EMBODIMENTS

Figure 1:
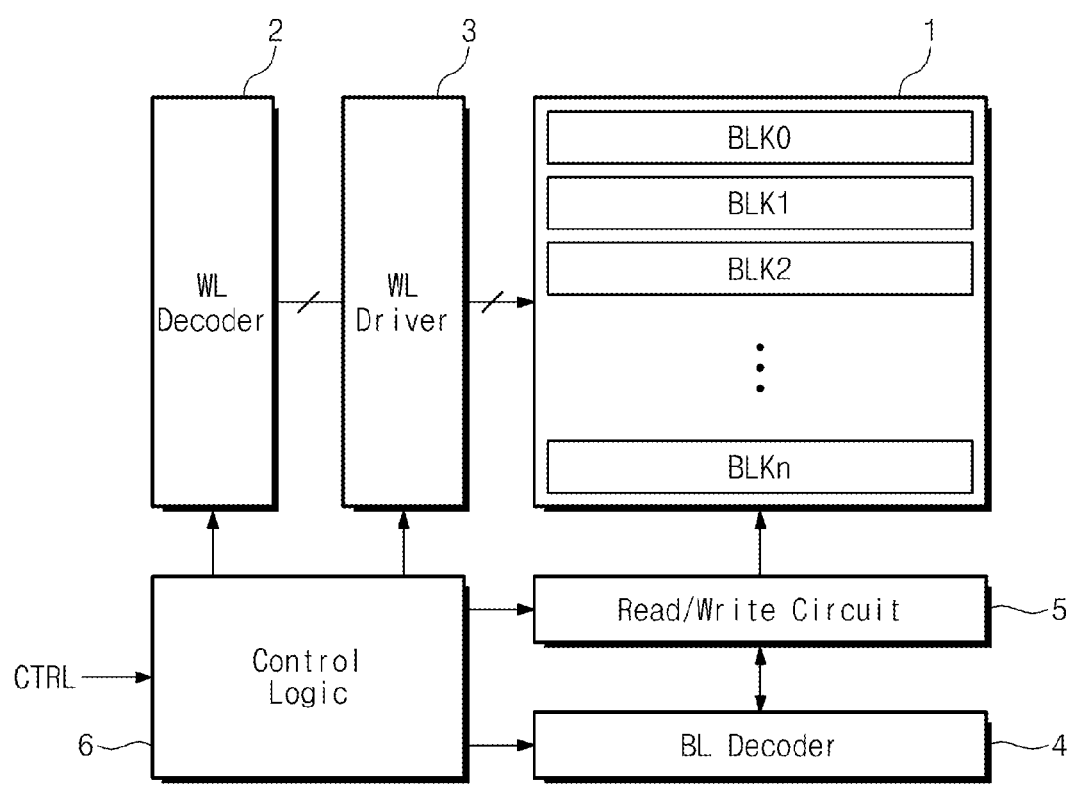
FIG. 1 is a schematic block diagram illustrating a semiconductor memory device according to example embodiments of inventive concepts.

Example embodiments of inventive concepts will now be described more fully hereinafter with reference to the accompanying drawings, in which some example embodiments of inventive concepts are shown. The advantages and features of inventive concepts and methods of achieving them will be apparent from the following example embodiments. It should be noted, however, that example embodiments of inventive concepts are not limited to the embodiments set forth herein; rather, these example embodiments are provided so that this disclosure will be thorough and complete, and will fully convey the scope of example embodiments to those of ordinary skill in the art inventive concepts. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit example embodiments. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. Expressions such as "at least one of," when preceding a list of elements, modify the entire list of elements and do not modify the individual elements of the list.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It will be also understood that although the terms first, second, third etc. may be used herein to describe various elements, these elements should not be limited by these terms. These terms are only used to distinguish one element from another element. Thus, a first element in example embodiments could be termed a second element in example embodiments without departing from the teachings of example embodiments. Example embodiments of inventive concept explained and illustrated herein include their complementary counterparts. The same reference numerals or the same reference designators denote the same elements throughout the specification.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a schematic block diagram illustrating a semiconductor memory device according to example embodiments of inventive concepts.

Referring to FIG. 1, a semiconductor memory device may include a memory cell array 1, a word line decoder 2, a word line driver 3, a bit line decoder 4, a read/write circuit 5, and a control logic circuit 6.

The memory cell array 1 may include a plurality of memory blocks BLK0 to BLKn, and each of the memory blocks BLK0 to BLKn may include a plurality of memory cells, a plurality of word lines, a plurality of bit lines, and a plurality of source lines. The word lines, the bit lines, and source lines may be electrically connected to the memory cells in each of the memory blocks BLK0 to BLKn.

The word line decoder 2 decodes an address signal inputted from an external system to select one of the word lines. The address signal decoded in the word line decoder 2 may be provided to the word line driver 3. The word line driver 3 may provide word line voltages generated from a voltage generating circuit (not shown) to the selected word line and unselected word lines in response to a control signal of the control logic circuit 6. The word line decoder 2 and the word line driver 3 may be connected in common to the plurality of memory blocks BLK0 to BLKn. The word line decoder 2 may provide driving signals to the word lines of one selected from among the memory blocks BLK0 to BLKn in response to a block selection signal.

The bit line decoder 4 decodes an address signal inputted from the external system to select one of the bit lines. The bit line decoder 4 may be connected in common to the plurality of memory blocks BLK0 to BLKn. The bit line decoder 4 may provide data to the bit lines of the selected one of the memory blocks BLK0 to BLKn in response to the block selection signal.

The read/write circuit 5 is connected to the memory cell array 1 through the bit lines. The read/write circuit 5 may select one of the bit lines in response to a bit line selection signal provided from the bit line decoder 4. The read/write circuit 5 may be configured to exchange data with the external system. The read/write circuit 5 is operated in response to a control signal of the control logic circuit 6. The read/write circuit 5 receives a power (e.g., a voltage or a current) from the control logic circuit 6 and provides the power to the selected bit line.

The control logic circuit 6 controls overall operations of the semiconductor memory device. The control logic circuit 6 may receive control signals and an external voltage and may be operated in response to the received control signals. The control logic circuit 6 may generate powers used for internal operations by means of the external voltage. The control logic circuit 6 controls at least one of read, write or erase operations in response to the control signals.

Figure 2:
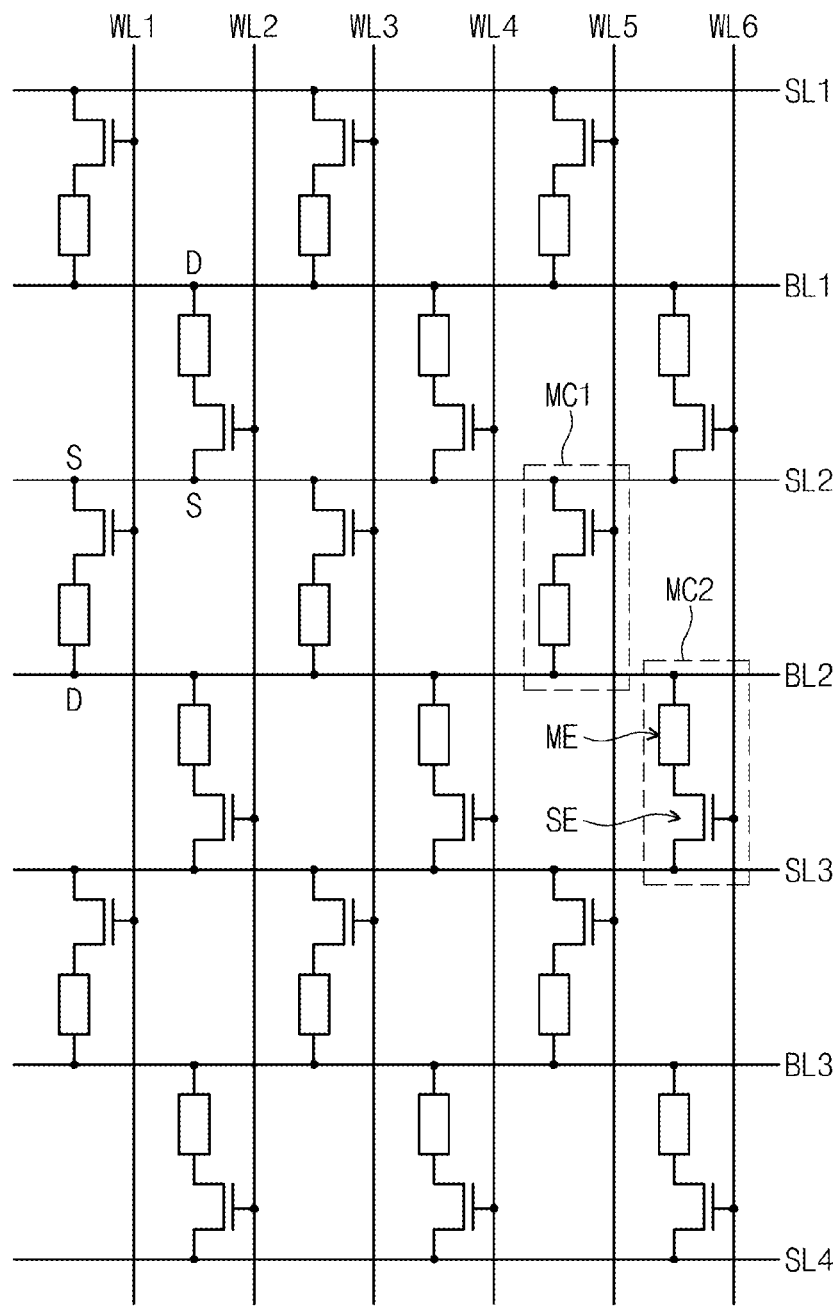
FIG. 2 is a circuit diagram illustrating a cell array of a semiconductor memory device according to example embodiments of inventive concepts.

FIG. 2 is a circuit diagram illustrating a cell array of a semiconductor memory device according to example embodiments of inventive concepts.

Referring to FIG. 2, a cell array may include word lines WL1 to WL6, bit lines BL1 to BL3, source lines SL1 to SL4, and memory cells MC1 and MC2. The bit lines BL1 to BL3 and the source lines SL1 to SL4 may intersect the word lines WL1 to WL6. Each of the bit lines BL1 to BL3 may be disposed between adjacent two of the source lines SL1 to SL4. In other words, the source lines SL1 to SL4 and the bit lines BL1 to BL3 may be alternately arranged in a longitudinal direction of the word lines WL1 to WL6. The memory cells MC1 and MC2 may be disposed at crossing regions where the bit lines BL1 to BL3 and the word lines WL1 to WL6 cross one another. The memory cells MC1 and MC2 may be arranged in a checkerboard form. According to example embodiments of inventive concepts, each of the memory cells MC1 and MC2 may include a selection element SE and a data storing element ME. The data storing element ME may be connected between one of the bit lines BL1 to BL3 and the selection element SE, and the selection element SE may be connected between the data storing element ME and one of the source lines SL1 to SL4. The selection element SE may be controlled by one of the word lines WL1 to WL6. According to example embodiments of inventive concepts, the data storing element ME may be a variable resistance element that is switchable between two resistance states by an electrical pulse applied thereto. In example embodiments, the data storing element ME may have a thin-layered structure of which an electrical resistance can be changed using spin-transfer torque of a current passing through the thin-layered structure. For example, the data storing element ME may have the thin-layered structure exhibiting a magnetoresistance property and may include at least one ferromagnetic material and/or at least one antiferromagnetic material. In example embodiments, the data storing element ME may include a phase-change material of which a phase can be changed depending on the amount of a current passing through the phase-change material. The phase-change material may include at least one of various materials such as a two-element compound (e.g., GaSb, InSb, InSe. $Sb_2Te_3$, or GeTe), a three-element compound (e.g., GeSbTe, GaSeTe, InSbTe, $SnSb_2Te_4$, or InSbGe), and a four-element compound (e.g., AgInSbTe, (GeSn)SbTe, GeSb(SeTe), $Te_{81}Ge_{15}Sb_2S_2$). The phase-change material may have an amorphous state having a relatively high resistance or a crystalline state having a relatively low resistance according to a temperature of heat applied thereto. The phase of the phase-change material may be changed by Joule's heat that occurs by a current applied to the phase-change material. The Joule's heat may be proportional to a specific resistance value of the phase-change material and a supply time of the current. Data may be written into and read from the data storing element ME by means of the phase change described above. In example embodiments, the data storing element ME may include at least one perovskite compound or at least one transition metal oxide.

The selection element SE may control the supply of the current to the data storing element ME in response to a voltage applied to corresponding one of the word lines WL1 to WL6. In example embodiments, the selection element SE may be a metal-oxide-semiconductor (MOS) field effect transistor.

In example embodiments, the memory cells MC1 and MC2 may include first memory cells MC1 and second memory cells MC2. The first memory cells MC1 may be respectively disposed at crossing regions of the bit lines BL1 to BL3 and odd-numbered word lines WL1, WL3, and WL5, and the second memory cells MC2 may be respectively disposed at crossing regions of the bit lines BL1 to BL3 and even-numbered word lines WL2, WL4, and WL6. The first and second memory cells MC1 and MC2 connected to each of the bit lines BL1 to BL3 may be alternately arranged along a longitudinal direction of the bit lines BL1 to BL3. For example, the first and second memory cells MC1 and MC2 connected to each of the bit lines BL1 to BL3 may be arranged in a zigzag form along the longitudinal direction of the bit lines BL1 to BL3. The first memory cell MC1 and the second memory cell MC2 which are adjacent to each other may be arranged in a direction diagonal to the longitudinal direction of the bit lines BL1 to BL3.

Each of the first and second memory cells MC1 and MC2 may be connected to one of the source lines SL1 to SL4 and one of the bit lines BL1 to BL3 which are adjacent thereto. The first memory cells MC1 arranged in the longitudinal direction of the word lines WL1 to WL6 may be connected to different source lines SL1 to SL4 from each other and different bit lines BL1 to BL3 from each other. Likewise, the second memory cells MC2 arranged in the longitudinal direction of the word lines WL1 to WL6 may be connected to different source lines SL1 to SL4 from each other and different bit lines BL1 to BL3 from each other.

Source terminals S of the first and second memory cells MC1 and MC2 connected to one of the bit lines BL1 to BL3 may be connected to different two of the source lines SL1 to SL4. Drain terminals D of the first and second memory cells MC1 and MC2 connected to one of the source lines SL1 to SL4 may be connected to different two of the bit lines BL1 to BL3. In other words, the source lines connected the first and second memory cells MC1 and MC2 sharing the bit line may be electrically separated from each other. In addition, the bit lines BL1 to BL3 connected to the first and second memory cells MC1 and MC2 sharing one of the source lines SL1 to SL4 may be electrically separated from each other.

In the cell array according to example embodiments of inventive concepts, one memory cell may be selected by means of the word lines WL1 to WL6 and the bit lines BL1 to BL3. In addition, the source lines of the memory cells connected to the selected word line may be electrically separated from each other. Thus, when one memory cell is selected, other memory cells adjacent to the selected memory cell are not selected. In addition, desired (and/or alternatively predetermined) voltages are applied to the bit line and the source line which are connected to the selected memory cell, so data may be written into or read from the selected memory cell. Here, different voltages from each other may be applied to the selected bit line and the selected source line.

Figure 3:
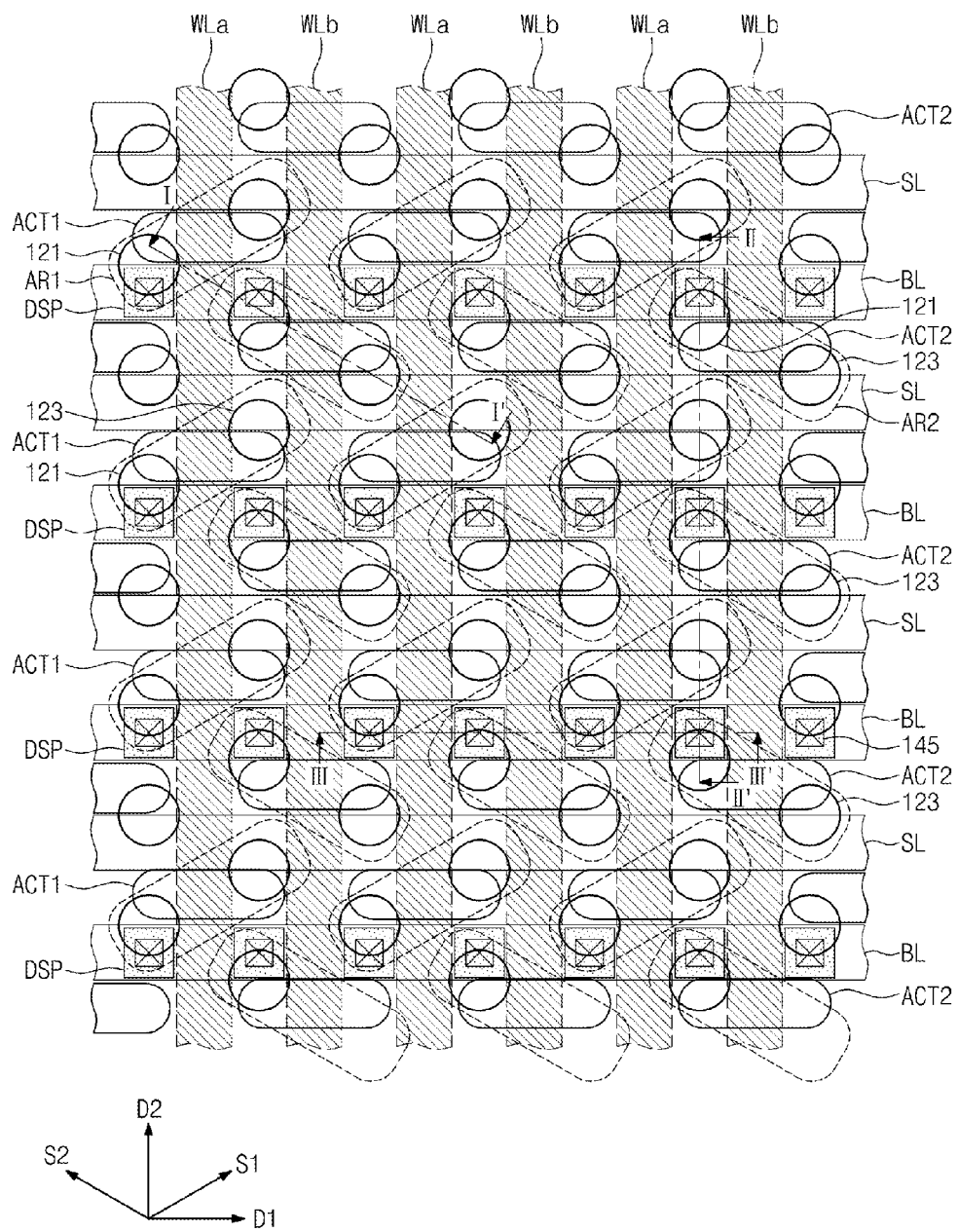
FIG. 3 is a plan view illustrating a semiconductor memory device according to example embodiments of inventive concepts.
Figure 4B:
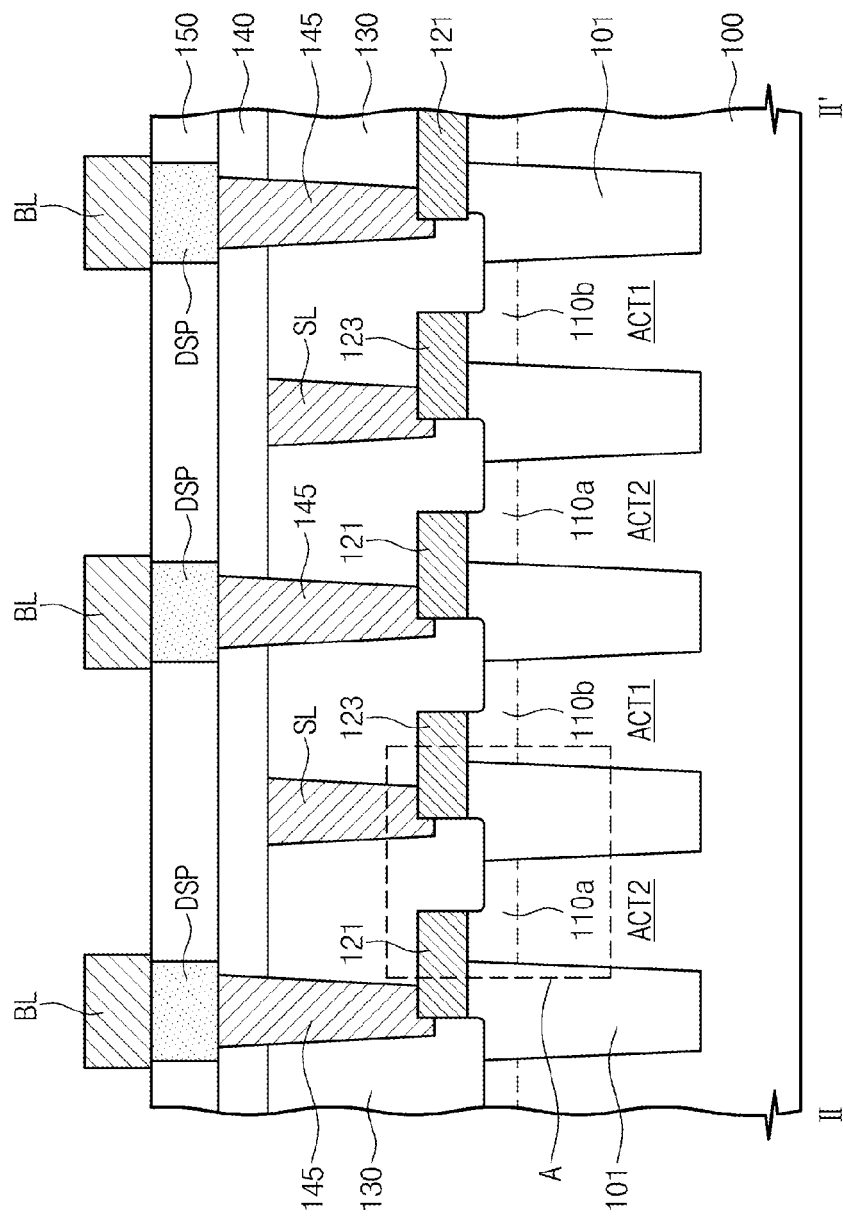
Figure 4C:
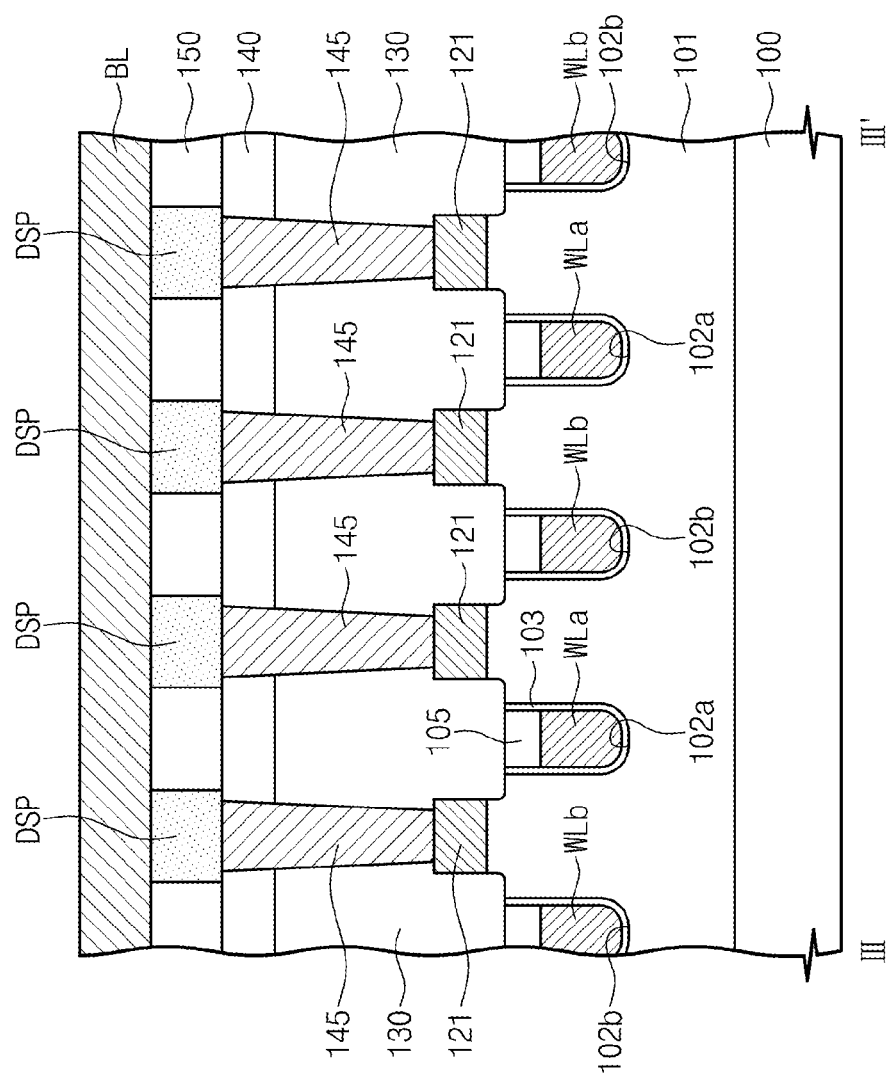
Figure 4D:
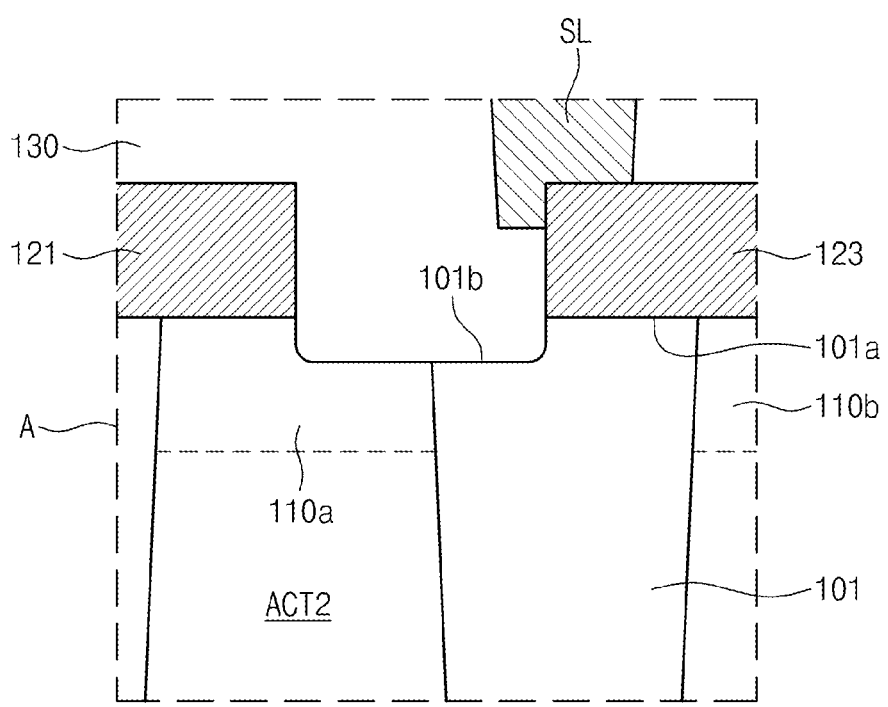
FIG. 4D is an enlarged view of a portion 'A' of FIG. 4A.

FIG. 3 is a plan view illustrating a semiconductor memory device according to example embodiments of inventive concepts. FIGS. 4A, 4B, and 4C are cross-sectional views taken along lines I-I', II-II', and III-III' of FIG. 3, respectively. FIG. 4D is an enlarged view of a portion 'A' of FIG. 4A.

Referring to FIGS. 3, 4A, 4B, and 4C, a device isolation layer 101 may be formed in a semiconductor substrate 100 to define first and second active patterns ACT1 and ACT2. The semiconductor substrate 100 may be a silicon substrate, a germanium substrate, or a silicon-germanium substrate. However, example embodiments are not limited thereto and other substrate materials may be suitable.

The first active patterns ACT1 may be two-dimensionally arranged along a plurality of first rows and a plurality of first columns. In other words, the first active patterns ACT1 arranged in a first direction D1 may constitute each of the first rows, and the first active patterns ACT arranged in a second direction D2 perpendicular to the first direction may constitute each of the first columns. Likewise, the second active patterns ACT2 may be two-dimensionally arranged along a plurality of second rows and a plurality of second columns. The second active patterns ACT2 arranged along the first direction D1 may constitute each of the second rows, and the second active patterns ACT2 arranged along the second direction D2 may constitute each of the second columns. The second active patterns ACT2 may be disposed to be spaced apart from the first active patterns ACT1 in a diagonal direction. In more detail, the second active patterns ACT2 may be offset from the first rows and the first columns. The first rows and the second rows may be alternately arranged in the second direction D2, and the first columns and the second columns may be alternately arranged in the first direction D1. The first and second active patterns ACT1 and ACT2 of the first and second rows adjacent to each other may be arranged in a zigzag form along the first direction D1. The first and second active patterns ACT1 and ACT2 of the first and second columns adjacent to each other may be arranged in a zigzag form along the second direction D2.

In example embodiments, each of the first and second active patterns ACT1 and ACT2 may have a rectangular shape (or a bar shape) of which a long axis is parallel to the first direction D1. A length, in the first direction D1, of the first active pattern ACT1 may be substantially equal to a length, in the first direction D1, of the second active pattern ACT2. The first and second active patterns ACT1 and ACT2 may be doped with dopants having a first conductivity type.

According to example embodiments, the semiconductor substrate 100 may have first gate recess regions 102a and second gate recess regions 102b. In example embodiments, the first and second gate recess regions 102a and 102b may be trenches extending along the second direction D2. The first and second gate recess regions 102a and 102b may be alternately arranged along the first direction D1.

Each of the first gate recess regions 102a may intersect the first active patterns ACT1 constituting each of the first columns, and each of the second gate recess regions 102b may intersect the second active patterns ACT2 constituting each of the second columns. Depths of the first and second gate recess regions 102a and 102b may be substantially equal to each other, and bottom surfaces of the first and second gate recess regions 102a and 102b may be higher than a bottom surface of the device isolation layer 101. The first and second gate recess regions 102a and 102b may have rounded bottom surfaces.

Word lines WLa and WLb may extend in the second direction D2. Odd-numbered word lines WLa may be disposed in the first gate recess regions 102a, respectively. Even-numbered word lines WLb may be disposed in the second gate recess regions 102b, respectively. In other words, the odd-numbered word lines WLa may intersect the first active patterns ACT1, and the even-numbered word lines WLb may intersect the second active patterns ACT2. In example embodiments, each of the odd-numbered word lines WLa may extend between the second active patterns ACT2 which are adjacent to each other in the first direction D1. Each of the even-numbered word lines WLb may extend between the first active patterns ACT1 which are adjacent to each other in the first direction D1.

A gate dielectric layer 103 may be disposed between each of the word lines WLa and WLb and an inner surface of each of the first and second gate recess regions 102a and 102b. A gate hard mask pattern 105 may be disposed on each of the word lines WLa and WLb. In example embodiments, top surfaces of the gate hard mask patterns 105 may be lower than a top surface of the semiconductor substrate 100.

For example, the gate dielectric layer 103 may include at least one of an oxide (e.g., silicon oxide), a nitride (e.g., silicon nitride), an oxynitride (e.g., silicon oxynitride), or a high-k dielectric material (e.g., an insulating metal oxide that has a higher dielectric constant than silicon oxide, such as hafnium oxide or aluminum oxide). The gate hard mask pattern 105 may include at least one of an oxide (e.g., silicon oxide), a nitride (e.g., silicon nitride), or an oxynitride (e.g., silicon oxynitride).

The word lines WLa and WLb may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

According to example embodiments, first dopant regions 110a may be formed in the first active patterns ACT1 at one side of the odd-numbered word line WLa and in the second active patterns ACT2 at one side of the even-numbered word line WLb. Second dopant regions 110b may be formed in the first active patterns ACT1 at another side of the odd-numbered word line WLa and in the second active patterns ACT2 at another side of the even-numbered word line WLb. In example embodiments, one of the first dopant regions 110a and one of the second dopant regions 110b may be formed in each of the first and second active patterns ACT1 and ACT2.

The first and second dopant regions 110a and 110b may be doped with dopants of which a second conductivity type is different from the first conductivity type of the first and second active patterns ACT1 and ACT2. One of the dopant having the first conductivity type and the dopant having the second conductivity type may be an N-type dopant, and the other of the dopant having the first conductivity type and the dopant having the second conductivity type may be a P-type dopant. The first and second dopant regions 110a and 110b may correspond to source/drain regions of a selection transistor. In other words, one selection transistor may be realized at each of the first and second active patterns ACT1 and ACT2.

According to example embodiments, first conductive pads 121 may be disposed on the first dopant regions 110a, respectively, and second conductive pads 123 may be disposed on the second dopant regions 110b, respectively. In example embodiments, the first conductive pads 121 and the second conductive pads 123 may be two-dimensionally arranged when viewed from a plan view. In more detail, the first and second conductive pads 121 and 123 may be alternately arranged along the second direction D2, and the second conductive pads 123 may be spaced apart from the first conductive pads 121 in a diagonal direction. The first conductive pads 121 which are formed on the first and second active patterns ACT1 and ACT2 of the first and second rows adjacent to each other may be arranged in a zigzag form along the first direction D1. The second conductive pads 123 which are formed on the first and second active patterns ACT1 and ACT2 of the first and second rows adjacent to each other may be arranged in a zigzag form along the first direction D1.

Each of the first conductive pads 121 may be in contact with a portion of the first or second active pattern ACT1 or ACT2 and a portion of the device isolation layer 101. Each of the second conductive pads 123 may be in contact with a portion of the first and second active pattern ACT1 and ACT2 and a portion of the device isolation layer 101. An effective area of each of the first and second active patterns ACT1 and ACT2 may be increased by the first and second conductive pads 121 and 123.

According to example embodiments of inventive concepts, each of the first active patterns ACT1 and the first and second conductive pads 121 and 132 disposed on each of the first active patterns ACT1 may constitute a first effective active region AR1. Here, the first and second conductive pads 121 and 123 of the first effective active region AR1 may be arranged in a first diagonal direction S1 with respect to the first and second directions D1 and D2. Each of the second active patterns ACT2 and the first and second conductive pads 121 and 132 disposed on each of the second active patterns ACT2 may constitute a second effective active region AR2. Here, the first and second conductive pads 121 and 123 of the second effective active region AR2 may be arranged in a second diagonal direction S2 with respect to the first and second directions D1 and D2. The second diagonal direction S2 may be different from the first diagonal direction S1. The first conductive pads 121 may increase contact areas between the first dopant regions 110a and contact plugs 145 formed on the first conductive pads 121. The second conductive pads 123 may increase contact areas between the second dopant regions 110b and source lines SL formed on the second conductive pads 123.

The first and second conductive pads 121 and 123 may include at least one of, for example, a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

A first interlayer insulating layer 130 may be disposed on an entire top surface of the semiconductor substrate 100 to cover the first and second conductive pads 121 and 123. Source lines SL extending in the first direction D1 may be disposed in the first interlayer insulating layer 130. The source lines SL may intersect the word lines WLa and WLb. Each of the source lines SL may be connected in common to the second conductive pads 123 arranged in the first direction D1.

In more detail, when viewed from a plan view, each of the source lines SL may be disposed between the first active pattern ACT1 and the second active pattern ACT2 which are adjacent to each other in the second direction D2. Each of the source lines SL may be connected in common to the second conductive pads 123 disposed on the first active patterns ACT1 arranged in the first direction D1 and the second conductive pads 123 disposed on the second active patterns ACT2 arranged in the first direction D1. That is, each of the source lines SL may be in contact with portions of the second conductive pads 123 arranged in the zigzag form along the first direction D1. In other words, each of the source lines SL may be electrically connected in common to the second dopant regions 110b formed in the first and second active patterns ACT1 and ACT2 adjacent to each other in the second direction D2.

In example embodiments, the source lines SL may be in contact with portions of sidewalls of the second conductive pads 123. The source lines SL may have non-flat bottom surfaces. Bottommost surfaces of the source lines SL may be disposed at a level between a top surface and a bottom surface of the second conductive pad 123. Top surfaces of the source lines SL may be substantially coplanar with a top surface of the first interlayer insulating layer 130.

For example, the source lines SL may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

A second interlayer insulating layer 140 may be disposed on an entire top surface of the first interlayer insulating layer 130. The second interlayer insulating layer 140 may cover the top surfaces of the source lines SL. If the source lines SL include a metal, the second interlayer insulating layer 140 may be formed of an insulating material capable of limiting and/or preventing metal atoms included in the source lines SL from being diffused into the second interlayer insulating layer 140. In addition, the second interlayer insulating layer 140 may include an insulating material having an etch selectivity with respect to the first interlayer insulating layer 130.

Contact plugs 145 may penetrate the second and first interlayer insulating layers 140 and 130. The contact plugs 145 may be connected to the first conductive pads 121, respectively. In other words, each of the contact plugs 145 may be electrically connected to the first dopant region 110a through the first conductive pad 121.

According to example embodiments, each of the contact plugs 145 may be in contact with a portion of each of the first conductive pads 121. The contact plug 145 may also be in contact with a portion of a sidewall of the first conductive pad 121. In this case, the contact plug 145 may have a bottommost surface that is lower than a top surface of the first conductive pad 121. In example embodiments, the contact plugs 145 may be arranged at equal intervals along the first direction D1. The contact plugs 145 may include at least one of, for example, a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

Data storing patterns DSP may be arranged on the second interlayer insulating layer 140 and may be disposed on the contact plugs 145, respectively. The data storing patterns DSP may be electrically connected to the first dopant regions 110a through the contact plugs 145, respectively.

The data storing patterns DSP may be two-dimensionally arranged along the first direction D1 and the second direction D2 when viewed from a plan view. In other words, the data storing patterns DSP arranged in the first direction D1 may constitute each row, and the data storing patterns DSP arranged in the second direction D2 may constitute each column. According to example embodiments, each of the data storing patterns DSP may be in contact with an entire top surface of each of the contact plugs 145. Each row consisting of the data storing patterns DSP may be disposed between the source lines SL adjacent to each other in the second direction D2 when viewed from a plan view. A distance between the data storing patterns DSP adjacent to each other in the first direction D1 may be smaller than a distance between the data storing patterns DSP adjacent to each other in the second direction D2. The data storing patterns DSP may be disposed between the word lines WLa and WLb when viewed from a plan view.

According to example embodiments of inventive concepts, each of the data storing patterns DSP may include a magnetic tunnel junction using magnetization directions, a transition metal oxide using an electrical path, or a phase-change material. The data storing pattern DSP will be described later in more detail.

In example embodiments, a third interlayer insulating layer 150 may fill a space between the data storing patterns DSP, and a top surface of the third interlayer insulating layer 150 may be substantially coplanar with top surfaces of the data storing patterns DSP. In example embodiments, the third interlayer insulating layer 150 may cover the top surfaces of the data storing patterns DSP. The third interlayer insulating layer 150 may be formed of at least one of an oxide (e.g., silicon oxide), a nitride (e.g., silicon nitride), or an oxynitride (e.g., silicon oxynitride).

Bit lines BL may be disposed on the data storing patterns DSP and the third interlayer insulating layer 150. The bit lines BL may be parallel to the source lines SL and may intersect the word lines WLa and WLb when viewed from a plan view. In other words, the bit lines BL may extend in parallel along the first direction D1. In example embodiments, each of the bit lines BL may be disposed between the source lines SL adjacent to each other, when viewed from a plan view. In addition, each of the bit lines BL may be disposed between the first and second active patterns ACT1 and ACT2 adjacent to each other in the second direction D2 when viewed from a plan view.

In example embodiments, each of the bit lines BL may be electrically connected to the data storing patterns DSP arranged along the first direction D1. In example embodiments, the bit lines BL may be in direct contact with the top surfaces of the data storing patterns DSP. Thus, each of the bit lines BL may be electrically connected in common to the first dopant regions 110a, which are formed in the first and second active patterns ACT1 and ACT2 adjacent to each other in the second direction D2, through the data storing patterns DSP and the contact plugs 145.

According to example embodiments of inventive concepts, the first and second active patterns ACT1 and ACT2 may be two-dimensionally arranged along the first and second directions D1 and D2 but the first and second effective active regions AR1 and AR2 may be arranged in the first and second diagonal directions S1 and S2 different from each other. Thus, an integration density of the semiconductor memory device may be improved.

The memory cells connected to one bit line BL may be connected to the source lines SL which are electrically separated from each other. The memory cells connected to the one source line SL may be connected to the bit lines BL which are electrically separated from each other. Even though a plurality of memory cells are connected to each of the bit lines BL and a plurality of memory cells are connected to each of the source lines SL, the first effective active regions AR1 are separated from the second effective active regions AR2. Thus, one word line WLa or WLb and one bit line BL may be selected to select one memory cell, and the selected memory cell may be electrically separated from unselected memory cells. In other words, the memory cells may be controlled independently of each other. As a result, write/read errors may be limited and/or prevented when the semiconductor memory device is operated.

In example embodiments, as illustrated in FIG. 4D, the device isolation layer 101 may have a first top surface 101a and a second top surface 101b. The first top surface 101a may be in contact with the first or second conductive pad 121 or 123, and the second top surface 101b may be in contact with the first interlayer insulating layer 130 between the first and second conductive pads 121 and 123. Here, the second top surface 101b may be lower than the first top surface 101a. In other words, the top surface 101b of a portion of the device isolation layer 101 may be lower than bottom surfaces of the first and second conductive pads 121 and 123. In addition, top surfaces of portions of the first and second active patterns ACT1 and ACT2 may be lower than the bottom surfaces of the first and second conductive pads 121 and 123. Furthermore, the top surfaces of the gate hard mask patterns 105 disposed on the word lines WLa and WLb may also be lower than the bottom surfaces of the first and second conductive pads 121 and 123.

In other words, the portions of the first and second active patterns ACT1 and ACT2 may be recessed between the first and second conductive pads 121 and 123, so it is possible to limit and/or prevent the first and second active patterns ACT1 and ACT2 adjacent to each other from being electrically connected to each other by misalignment of the first and second conductive pads 121 and 123.

Figure 5:
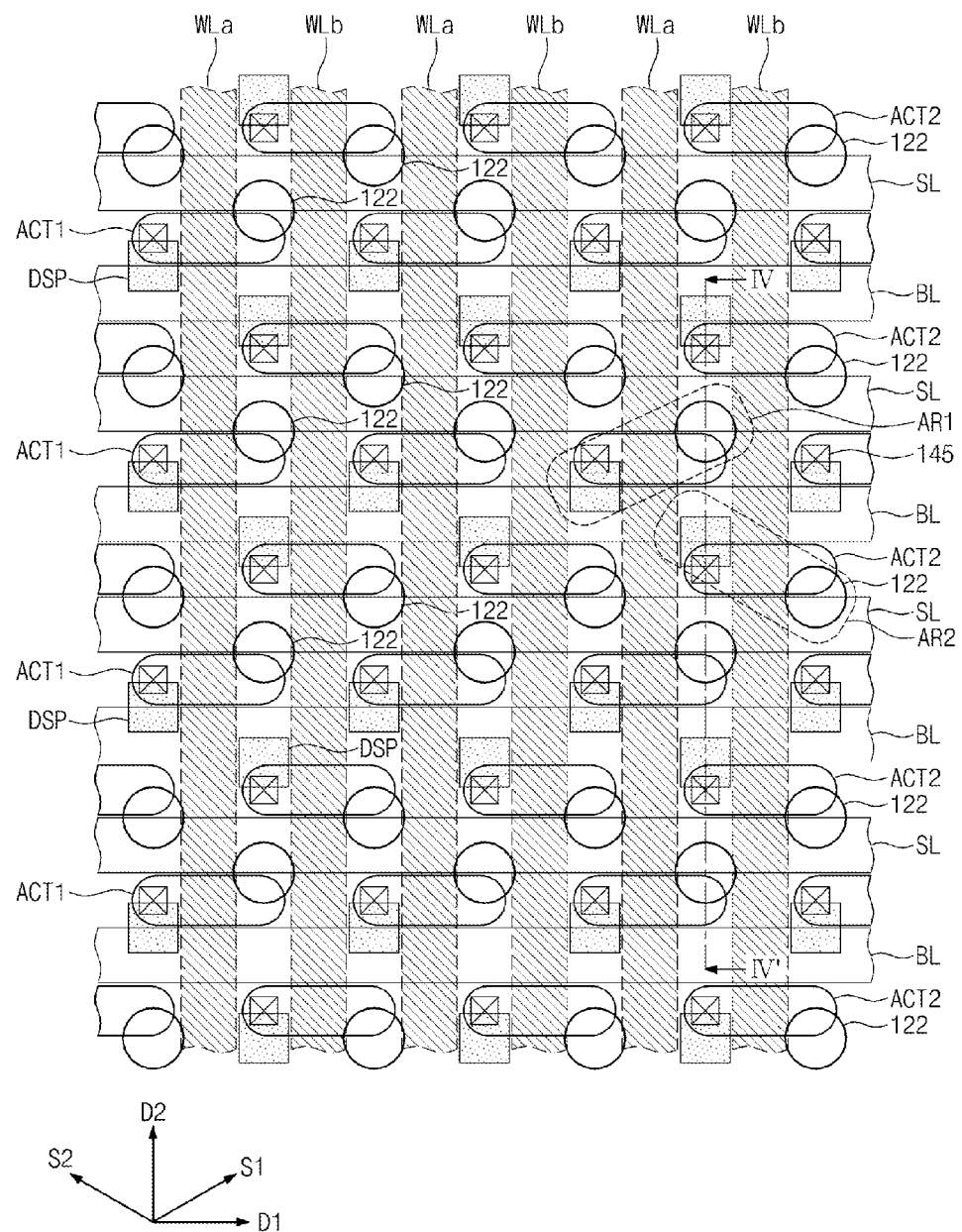
FIG. 5 is a plan view illustrating a semiconductor memory device according to example embodiments of inventive concepts.
Figure 6:
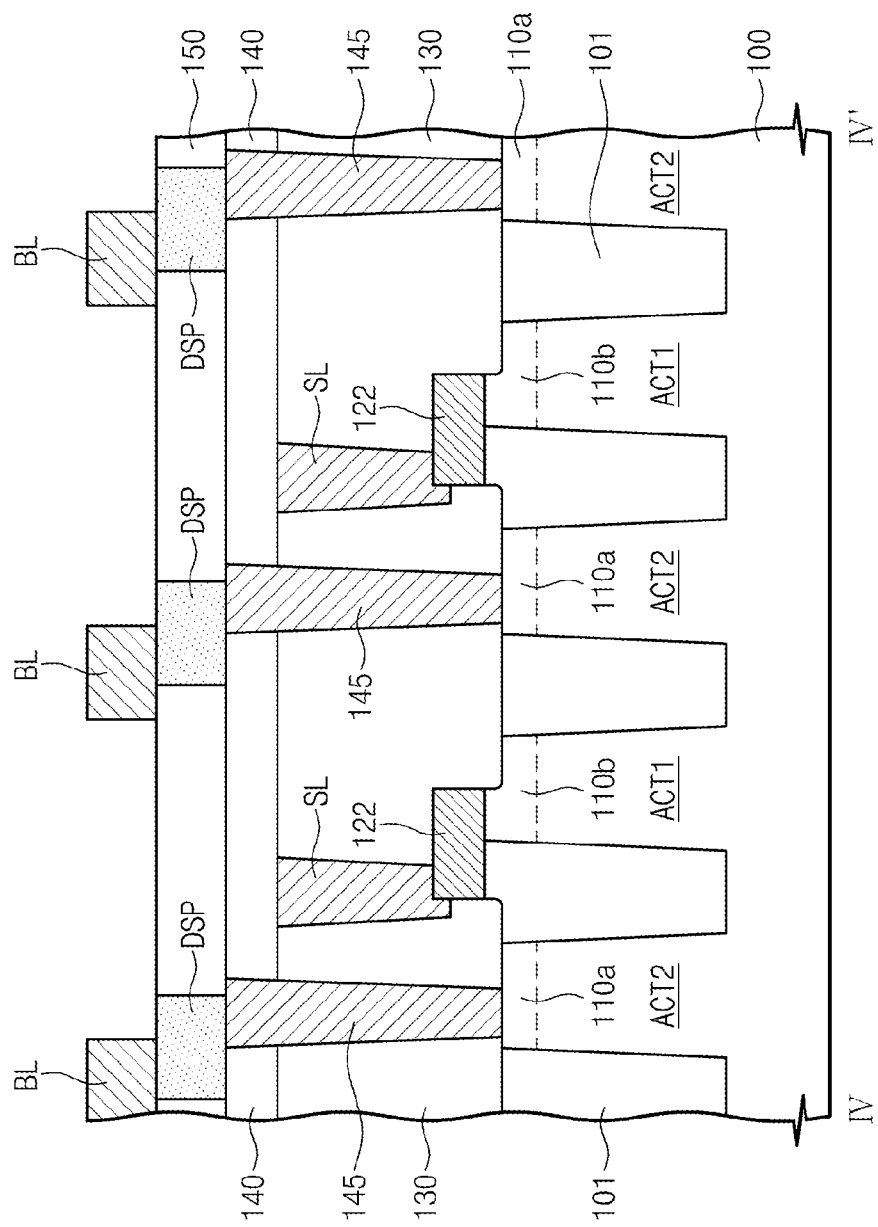
FIG. 6 is a cross-sectional view taken along a line IV-IV' of FIG. 5.

FIG. 5 is a plan view illustrating a semiconductor memory device according to example embodiments of inventive concepts. FIG. 6 is a cross-sectional view taken along a line IV-IV' of FIG. 5.

Referring to FIGS. 5 and 6, a device isolation layer 101 may be formed in a semiconductor substrate 100 to define first and second active patterns ACT1 and ACT2. The first active patterns ACT1 may be two-dimensionally arranged along first and second directions D1 and D2 perpendicular to each other. The first active patterns ACT1 may constitute first rows and first columns. The second active patterns ACT2 may be two-dimensionally arranged along the first and second directions D1 and D2 to constitute second rows and second columns. The second active patterns ACT2 may be spaced apart from the first active patterns ACT1 in a direction diagonal to the second direction D2.

In example embodiments, each of the first and second active patterns ACT1 and ACT2 may have a rectangular shape (or a bar shape) of which a long axis is parallel to the first direction D1. A length, in the first direction D1, of the first active pattern ACT1 may be substantially equal to a length, in the first direction D1, of the second active pattern ACT2. The first and second active patterns ACT1 and ACT2 may be doped with dopants having a first conductivity type.

According to example embodiments, the semiconductor substrate 100 may have first gate recess regions 102a and second gate recess regions 102b. In example embodiments, the first and second gate recess regions 102a and 102b may be trenches extending along the second direction D2. The first and second gate recess regions 102a and 102b may be alternately arranged along the first direction D1.

Each of the first gate recess regions 102a may intersect the first active patterns ACT1 constituting each of the first columns, and each of the second gate recess regions 102b may intersect the second active patterns ACT2 constituting each of the second columns. Depths of the first gate recess regions 102a may be substantially equal to depths of the second gate recess regions 102b, and bottom surfaces of the first and second gate recess regions 102a and 102b may be higher than a bottom surface of the device isolation layer 101. The first and second gate recess regions 102a and 102b may have rounded bottom surfaces.

Word lines WLa and WLb may extend in the second direction D2. Odd-numbered word lines WLa may be disposed in the first gate recess regions 102a, respectively. Even-numbered word lines WLb may be disposed in the second gate recess regions 102b, respectively. In other words, the odd-numbered word lines WLa may intersect the first active patterns ACT1, and the even-numbered word lines WLb may intersect the second active patterns ACT2. In example embodiments, each of the odd-numbered word lines WLa may extend between the second active patterns ACT2 which are adjacent to each other in the first direction D1. Each of the even-numbered word lines WLb may extend between the first active patterns ACT1 which are adjacent to each other in the first direction D1.

According to example embodiments, first dopant regions 110a may be formed in the first active patterns ACT1 at one side of the odd-numbered word line WLa and in the second active patterns ACT2 at one side of the even-numbered word line WLb. Second dopant regions 110b may be formed in the first active patterns ACT1 at another side of the odd-numbered word line WLa and in the second active patterns ACT2 at another side of the even-numbered word line WLb. In example embodiments, one of the first dopant regions 110a and one of the second dopant regions 110b may be formed in each of the first and second active patterns ACT1 and ACT2.

The first and second dopant regions 110a and 110b may be doped with dopants of which a second conductivity type is different from the first conductivity type of the first and second active patterns ACT1 and ACT2. One of the first and second conductivity types may be an N-type, and the other of the first and second conductivity types may be a P-type. The first and second dopant regions 110a and 110b may correspond to source/drain regions of a selection transistor. In other words, one selection transistor may be realized at each of the first and second active patterns ACT1 and ACT2.

In example embodiments, conductive pads 122 may be disposed on the second dopant regions 110b, respectively. The conductive pads 122 may be arranged along the first and second directions D1 and D2. The conductive pads 122, which are formed on the first and second active patterns ACT1 and ACT2 of the first and second rows adjacent to each other, may be arranged in a zigzag form along the first direction D1. In other words, the conductive pads 122 formed on the first active patterns ACT1 may be spaced apart from the conductive pads 122 formed on the second active patterns ACT2 in a diagonal direction.

Each of the conductive pads 122 may be in contact with a portion of the first or second active pattern ACT1 or ACT2 and a portion of the device isolation layer 101. Effective areas of the first and second active patterns ACT1 and ACT2 may be increased by the conductive pads 122. In other words, each of the first active patterns ACT1 and the conductive pad 122 thereon may constitute a first effective active region AR1, and each of the second active patterns ACT2 and the conductive pad 122 thereon may constitute a second effective active region AR2. The conductive pad 122 of the first effective active region AR1 may be spaced apart from a central point of the first active pattern ACT1 in a first diagonal direction S1 with respect to the first and second directions D1 and D2. The conductive pad 122 of the second effective active region AR2 may be spaced apart from a central point of the second active pattern ACT2 in a second diagonal direction S2 with respect to the first and second directions D1 and D2. Here, the second diagonal direction S2 may be different from the first diagonal direction S1. The conductive pads 122 may increase contact areas between the second dopant regions 110b and source lines SL formed on the conductive pads 122.

In example embodiments, a top surface of a portion of the device isolation layer 101 may be lower than bottom surfaces of the conductive pads 122. In other words, the top surface of the portion of the device isolation layer 101 may be recessed. In addition, top surfaces of the first and second active patterns ACT1 and ACT2 may be partially recessed.

A first interlayer insulating layer 130 may cover the conductive pads 122 and may be disposed on an entire top surface of the semiconductor substrate 100. Source lines SL may be disposed in the first interlayer insulating layer 130. The source lines SL may intersect the word lines WLa and WLb. Each of the source lines SL may be connected in common to the conductive pads 122 which are arranged in the zigzag form along the first direction D1.

Each of the source lines SL may be disposed between the first and second active patterns ACT1 and ACT2 adjacent to each other in the second direction D2 when viewed from a plan view. Each of the source lines may be in contact with portions of the conductive pads 122 arranged in the zigzag form. Each of the source lines SL may be electrically connected in common to the second dopant regions 110b, which are formed in the first and second active patterns ACT1 and ACT2 adjacent to each other in the second direction D2, through the conductive pads 122.

In example embodiments, the source lines SL may be in contact with portions of sidewalls of the conductive pads 122, so the source lines SL may have non-flat bottom surfaces. Bottommost surfaces of the source lines SL may be disposed at a level between a top surface and a bottom surface of the conductive pad 122. Top surfaces of the source lines SL may be substantially coplanar with a top surface of the first interlayer insulating layer 130.

A second interlayer insulating layer 140 may be disposed on an entire top surface of the first interlayer insulating layer 130. The second interlayer insulating layer 140 may cover the top surfaces of the source lines SL.

Contact plugs 145 may penetrate the second and first interlayer insulating layers 140 and 130 so as to be electrically connected to the first dopant region 110a, respectively. In example embodiments, each of the contact plugs 145 may be in direct contact with each of the first dopant regions 110a.

Data storing patterns DSP may be disposed on the contact plugs 145, respectively. The data storing patterns DSP may be electrically connected to the first dopant regions 110a through the contact plugs 145, respectively.

In example embodiments, the data storing patterns DSP may be two-dimensionally arranged along the first and second directions D1 and D2 when viewed from a plan view. The data storing patterns DSP may be arranged in a zigzag form along the first direction D1 between the source lines SL adjacent to each other when viewed from a plan view. Each of the data storing patterns DSP may be in contact with a portion of a top surface of the contact plug 145. According to example embodiments, the data storing patterns DSP may be arranged in the zigzag form, so process margins may be increased when the data storing patterns DSP are formed. The data storing pattern DSP may include a magnetic tunnel junction using magnetization directions, a transition metal oxide using an electrical path, or a phase-change material.

In example embodiments, a third interlayer insulating layer 150 may fill a space between the data storing patterns DSP, and a top surface of the third interlayer insulating layer 150 may be substantially coplanar with top surfaces of the data storing patterns DSP. In example embodiments, the third interlayer insulating layer 150 may extend to cover the top surfaces of the data storing patterns DSP.

Bit lines BL may be disposed on the data storing patterns DSP and the third interlayer insulating layer 150. The bit lines BL may be parallel to the source lines SL and may intersect the word lines WLa and WLb when viewed from a plan view. In other words, the bit lines BL may extend in parallel to each other along the first direction D1. In example embodiments, each of the bit lines BL may be disposed between the source lines SL adjacent to each other when viewed from a plan view. In addition, each of the bit lines BL may be disposed between the first and second active patterns ACT1 and ACT2 adjacent to each other in the second direction D2 when viewed from a plan view.

In example embodiments, each of the bit lines BL may be in contact with portions of the data storing patterns DSP arranged along the first direction D1. In other words, each of the bit lines BL may be connected in common to the data storing patterns DSP arranged in the zigzag form along the first direction D1. Thus, each of the bit line BL may be connected in common to the first dopant regions 110a, which are formed in the first and second active patterns ACT1 and ACT2 adjacent to each other in the second direction D2, through the data storing patterns DSP and the contact plugs 145.

Figure 7:
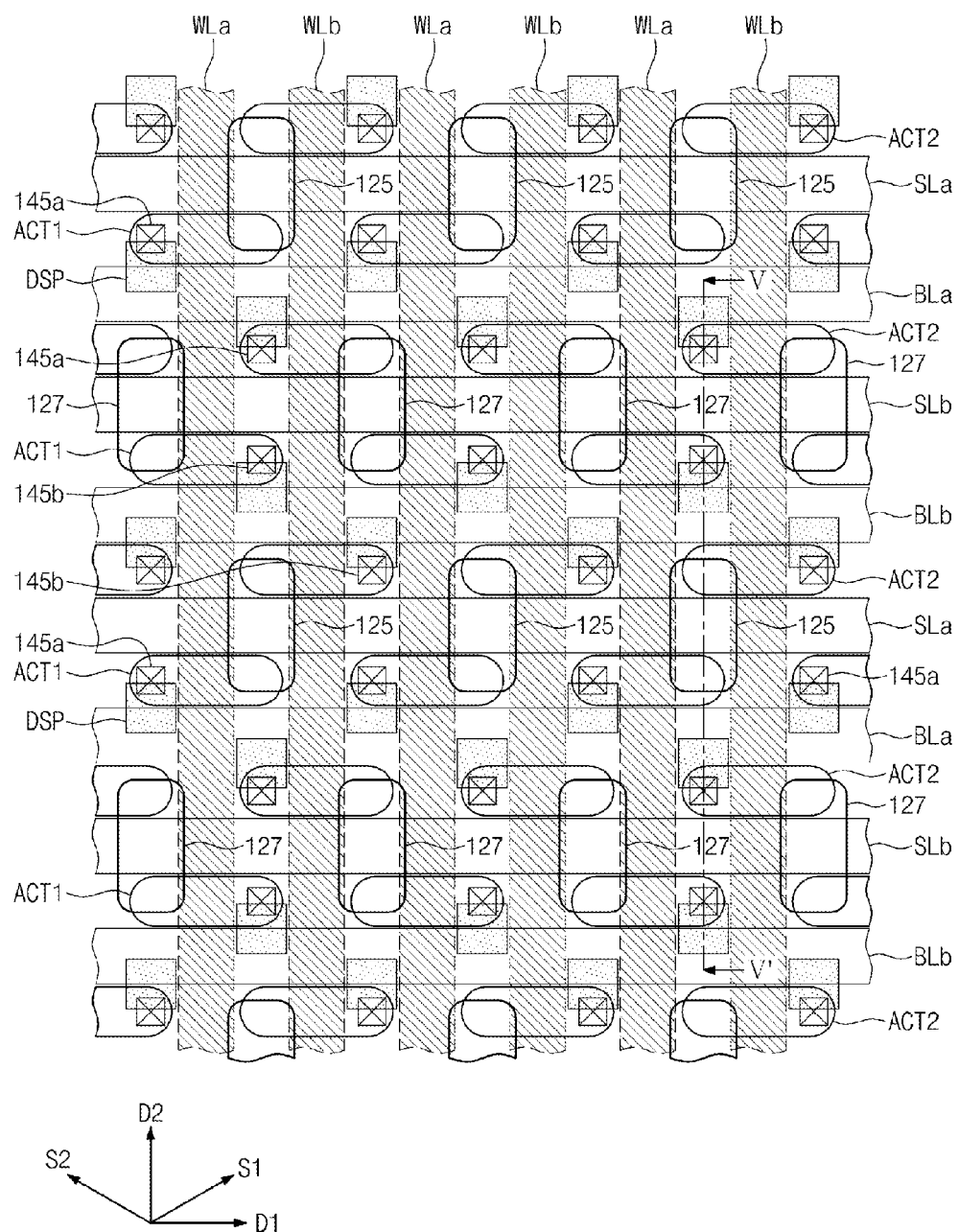
FIG. 7 is a plan view illustrating a semiconductor memory device according to example embodiments of inventive concepts.
Figure 8:
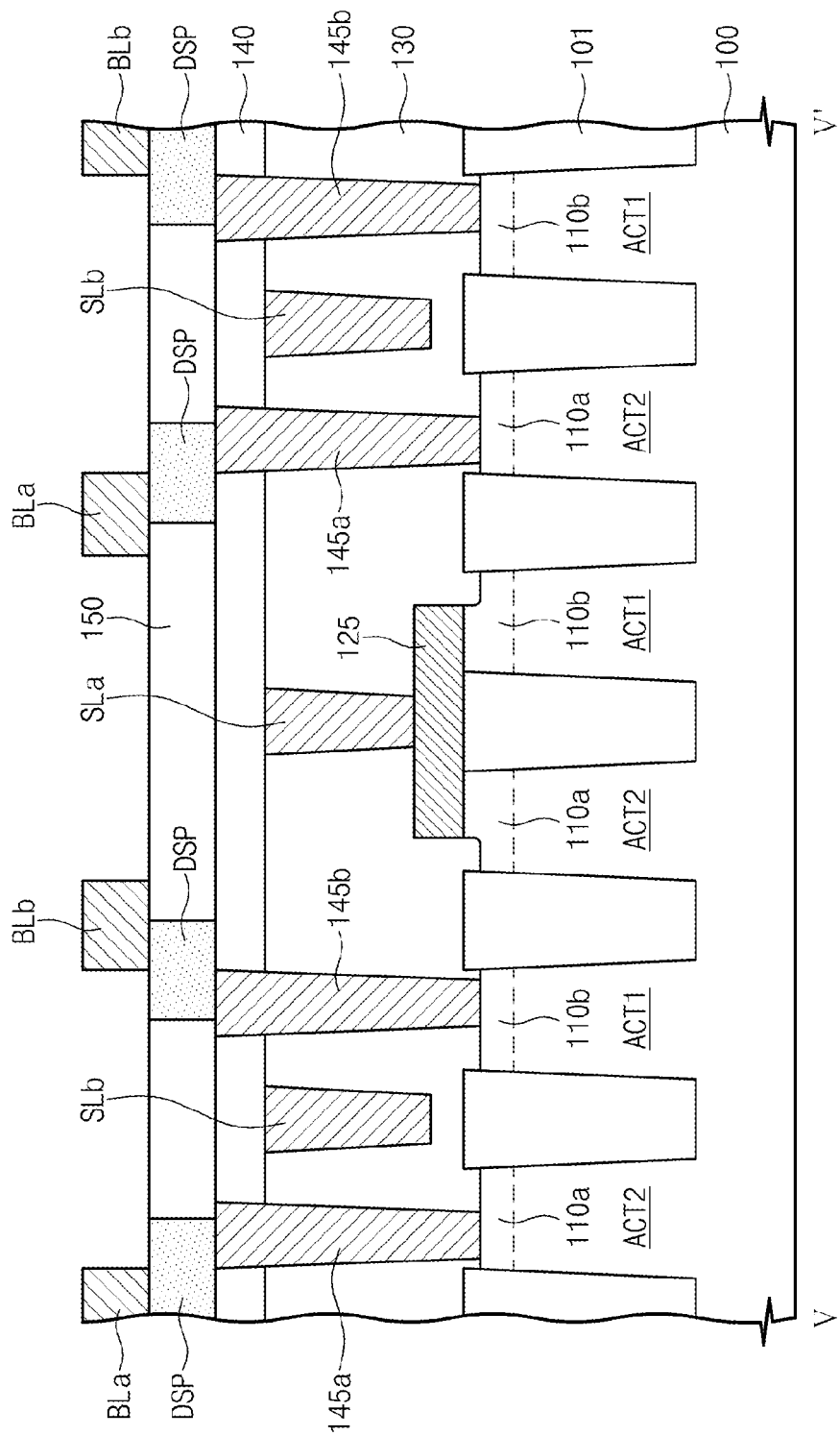
FIG. 8 is a cross-sectional view taken along a line V-V' of FIG. 7.

FIG. 7 is a plan view illustrating a semiconductor memory device according to example embodiments of inventive concepts. FIG. 8 is a cross-sectional view taken along a line V-V' of FIG. 7.

Referring to FIGS. 7 and 8, a device isolation layer 101 may be formed in a semiconductor substrate 100 to define first and second active patterns ACT1 and ACT2. The first active patterns ACT1 may be two-dimensionally arranged along first and second directions D1 and D2 perpendicular to each other. The first active patterns ACT1 may constitute first rows and first columns. The second active patterns ACT2 may be two-dimensionally arranged along the first and second directions D1 and D2 to constitute second rows and second columns. The second active patterns ACT2 may be spaced apart from the first active patterns ACT1 in a direction diagonal to the second direction D2.

In example embodiments, each of the first and second active patterns ACT1 and ACT2 may have a rectangular shape (or a bar shape) of which a long axis is parallel to the first direction D1. In the first direction D1, a length of the first active pattern ACT1 may be substantially equal to a length of the second active pattern ACT2. The first and second active patterns ACT1 and ACT2 may be doped with dopants having a first conductivity type.

According to example embodiments, the semiconductor substrate 100 may have first gate recess regions 102a and second gate recess regions 102b. In example embodiments, the first and second gate recess regions 102a and 102b may be trenches extending in the second direction D2. The first and second gate recess regions 102a and 102b may be alternately arranged along the first direction D1.

Each of the first gate recess regions 102a may intersect the first active patterns ACT1 constituting each of the first columns, and each of the second gate recess regions 102b may intersect the second active patterns ACT2 constituting each of the second columns. Depths of the first gate recess regions 102a may be substantially equal to depths of the second gate recess regions 102b, and bottom surfaces of the first and second gate recess regions 102a and 102b may be higher than a bottom surface of the device isolation layer 101. The first and second gate recess regions 102a and 102b may have rounded bottom surfaces.

Word lines WLa and WLb may extend in the second direction D2. Odd-numbered word lines WLa may be disposed in the first gate recess regions 102a, respectively. Even-numbered word lines WLb may be disposed in the second gate recess regions 102b, respectively. In other words, the odd-numbered word lines WLa may intersect the first active patterns ACT1, and the even-numbered word lines WLb may intersect the second active patterns ACT2. In example embodiments, each of the odd-numbered word lines WLa may extend between the second active patterns ACT2 which are adjacent to each other in the first direction D1. Each of the even-numbered word lines WLb may extend between the first active patterns ACT1 which are adjacent to each other in the first direction D1.

According to example embodiments, first dopant regions 110a may be formed in the first active patterns ACT1 at one side of the odd-numbered word line WLa and in the second active patterns ACT2 at one side of the even-numbered word line WLb. Second dopant regions 110b may be formed in the first active patterns ACT1 at another side of the odd-numbered word line WLa and in the second active patterns ACT2 at another side of the even-numbered word line WLb. In example embodiments, one of the first dopant regions 110a and one of the second dopant regions 110b may be formed in each of the first and second active patterns ACT1 and ACT2.

The first and second dopant regions 110a and 110b may be doped with dopants of which a second conductivity type is different from the first conductivity type of the first and second active patterns ACT1 and ACT2. One of the first and second conductivity types may be an N-type, and the other of the first and second conductivity types may be a P-type.

The first and second dopant regions 110a and 110b may correspond to source/drain regions of a selection transistor. In other words, one selection transistor may be realized at each of the first and second active patterns ACT1 and ACT2.

In example embodiments, first and second connection pads 125 and 127 may be disposed on some of the first and second dopant regions 110a and 110b. In a plan view, the first and second connection pads 125 and 127 may be two-dimensionally arranged in the first and second directions D1 and D2 and the second connection pads 127 may be spaced apart from the first connection pads 125 in a diagonal direction.

In more detail, each of the first connection pads 125 may connect the first active pattern ACT1 and the second active pattern ACT2, which are adjacent to each other in the second direction D2, to each other. In other words, each of the first connection pads 125 may be connected in common to the second dopant region 110b of the first active pattern ACT1 and the first dopant region 110a of the second active pattern ACT2. The first connection pad 125 may extend from a top surface of the second dopant region 110b of the first active pattern ACT1 onto a top surface of the first dopant region 110a of the second active pattern ACT2. In addition, the first connection pad 125 may be in direct contact with a portion of the device isolation layer 101 between the first and second active patterns ACT1 and ACT2 which are adjacent to each other in the second direction D2.

Each of the second connection pads 127 may connect the first active pattern ACT1 with the second active pattern ACT2, which are adjacent to each other in the second direction D2, to each other. Each of the second connection pads 127 may be connected in common to the first dopant region 110a of the first active pattern ACT1 and the second dopant region 110b of the second active pattern ACT2. In other words, the second connection pad 127 may extend from a top surface of the first dopant region 110a of the first active pattern ACT1 onto a top surface of the second dopant region 110b of the second active pattern ACT2. In addition, the second connection pad 127 may be in direct contact with a portion of the device isolation layer 101 between the first and second active patterns ACT1 and ACT2 which are adjacent to each other in the second direction D2. The first and second active patterns ACT1 and ACT2 connected to the first connection pad 125 are different from the first and second active patterns ACT1 and ACT2 connected to the second connection pad 127. In other words, each of the first and second active patterns ACT1 and ACT2 may be connected to one of the first and second connection pads 125 and 127. For example, the first and second active patterns ACT1 and ACT2 connected to the first connection pads 125 may constitute odd-numbered ones of the first rows and odd-numbered ones of the second rows, and the first and second active patterns ACT1 and ACT2 connected to the second connection pads 127 may constitute even-numbered ones of the first rows and even-numbered ones of the second rows.

In example embodiments, the first and second active patterns ACT1 and ACT2 and the device isolation layer 101, which are disposed between the first and second connection pads 125 and 127, may have recessed top surfaces.

A first interlayer insulating layer 130 may be disposed on an entire top surface of the semiconductor substrate 100 to cover the first and second connection pads 125 and 127. Source lines SLa and SLb may be disposed in the first interlayer insulating layer 130. The source lines SLa and SLb may intersect the word lines WLa and WLb. Each of the source lines SLa and SLb may be connected in common to the first connection pads 125 arranged in the first direction D1 or the second connection pads 127 arranged in the first direction D1.

Each of the source lines SLa and SLb may be disposed between the first and second active patterns ACT1 and ACT2 adjacent to each other in the second direction D2 when viewed from a plan view. Each of the source lines SLa and SLb may be in contact with portions of the first connection pads 125 or portions of the second connection pads 127.

According to example embodiments, odd-numbered source lines SLa may be connected in common to the second dopant regions 110b of the first active patterns ACT1 of the odd-numbered ones of the first rows and the first dopant regions 110a of the second active patterns ACT2 of the odd-numbered ones of the second rows through the first connection pads 125. Even-numbered source lines SLb may be connected in common to the first dopant regions 110a of the first active patterns ACT1 of the even-numbered ones of the first rows and the second dopant regions 110b of the second active patterns ACT2 of the even-numbered ones of the second rows through the second connection pads 127.

A second interlayer insulating layer 140 may be disposed on an entire top surface of the first interlayer insulating layer 130. The second interlayer insulating layer 140 may cover the top surfaces of the source lines SLa and SLb.

According to example embodiments, first contact plugs 145a may penetrate the second and first interlayer insulating layers 140 and 130 so as to be respectively connected to the first dopant region 110a not connected to the first and second connection pads 125 and 127. Second contact plugs 145b may penetrate the second and first interlayer insulating layers 140 and 130 so as to be respectively connected to the second dopant region 110b not connected to the first and second connection pads 125 and 127.

Data storing patterns DSP may be disposed on the first and second contact plugs 145a and 145b, respectively. Each of the data storing patterns DSP may be in contact with a portion of the first or second contact plug 145a or 145b.

In example embodiments, the data storing patterns DSP may be two-dimensionally arranged along the first and second directions D1 and D2 on the second interlayer insulating layer 140. The data storing patterns DSP may be arranged in a zigzag form along the first direction D1 between the source lines SLa and SLb adjacent to each other when viewed from a plan view. In other words, the data storing patterns DSP connected to the first contact plugs 145a may be arranged in the zigzag form along the first direction D1, and the data storing patterns DSP connected to the second contact plugs 145b may be arranged in the zigzag form along the first direction D1.

In example embodiments, a third interlayer insulating layer 150 may fill a space between the data storing patterns DSP, and a top surface of the third interlayer insulating layer 150 may be substantially coplanar with top surfaces of the data storing patterns DSP. In example embodiments, the third interlayer insulating layer 150 may cover the top surfaces of the data storing patterns DSP.

Bit lines BLa and BLb may be disposed on the data storing patterns DSP and the third interlayer insulating layer 150. The bit lines BLa and BLb may be parallel to the source lines SL and may intersect the word lines WLa and WLb when viewed from a plan view. In other words, the bit lines BLa and BLb may extend in parallel to each other along the first direction D1. In example embodiments, each of the bit lines BLa and BLb may be disposed between the source lines SLa and SLb adjacent to each other when viewed from a plan view. In addition, each of the bit lines BLa and BLb may be disposed between the first and second active patterns ACT1 and ACT2 adjacent to each other in the second direction D2 when viewed from a plan view.

In example embodiments, each of odd-numbered bit lines BLa may be connected in common to the first dopant regions 110a of the first and second active patterns ACT1 and ACT2 through the data storing patterns DSP and the first contact plugs 145a. Each of even-numbered bit lines BLb may be connected in common to the second dopant regions 110b of the first and second active patterns ACT1 and ACT2 through the data storing patterns DSP and the second contact plugs 145b. In example embodiments, each of the bit lines BLa and BLb may be in contact with portions of the data storing patterns DSP arranged in the zigzag form along the first direction D1.

According to example embodiments, the source lines SLa and SLb connected to the memory cells sharing one bit line BLa or BLb may be electrically separated from each other, and the bit lines BLa and BLb connected to the memory cells sharing one source line SLa or SLb may be electrically separated from each other.

Figure 9:
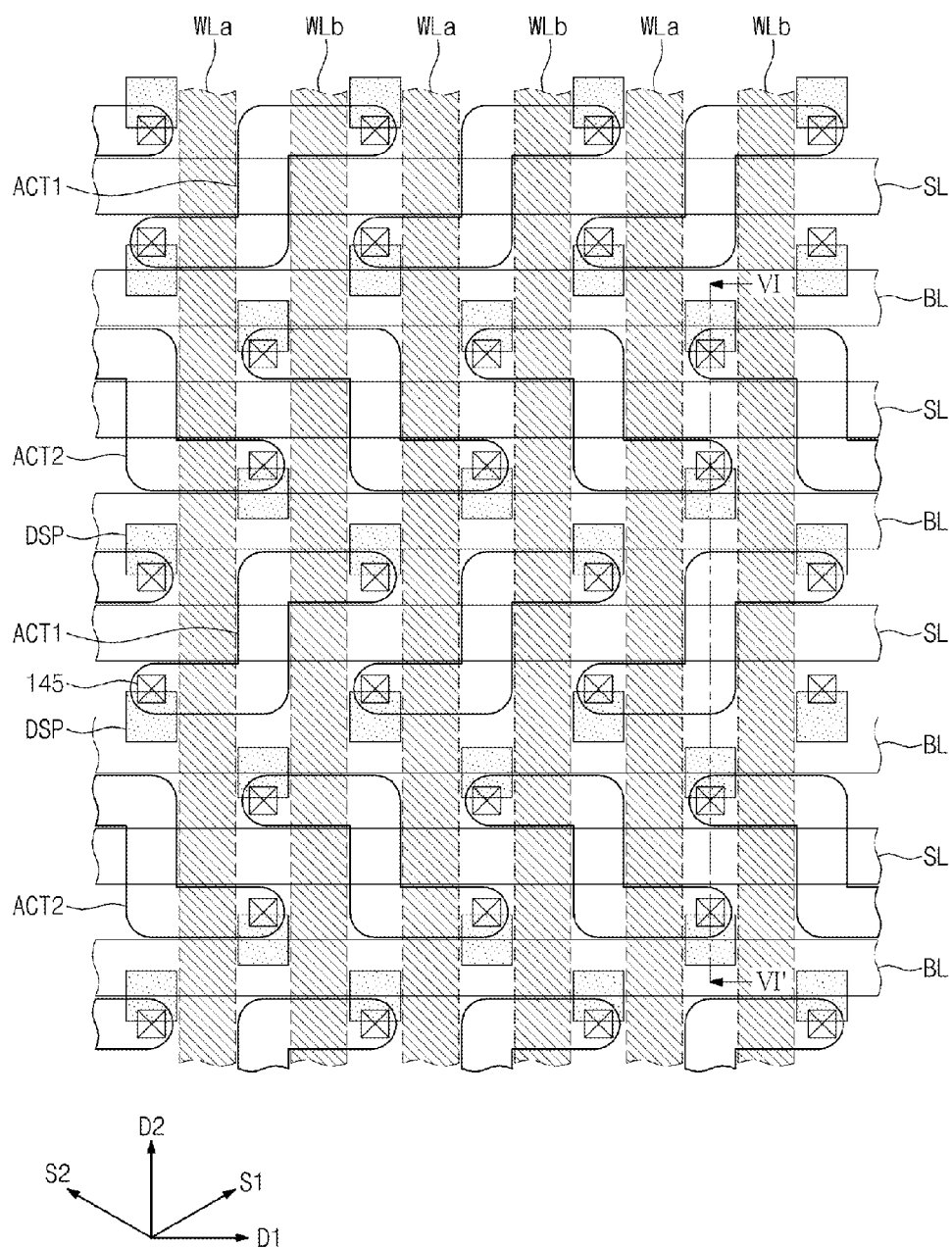
FIG. 9 is a plan view illustrating a semiconductor memory device according to example embodiments of inventive concepts.
Figure 10:
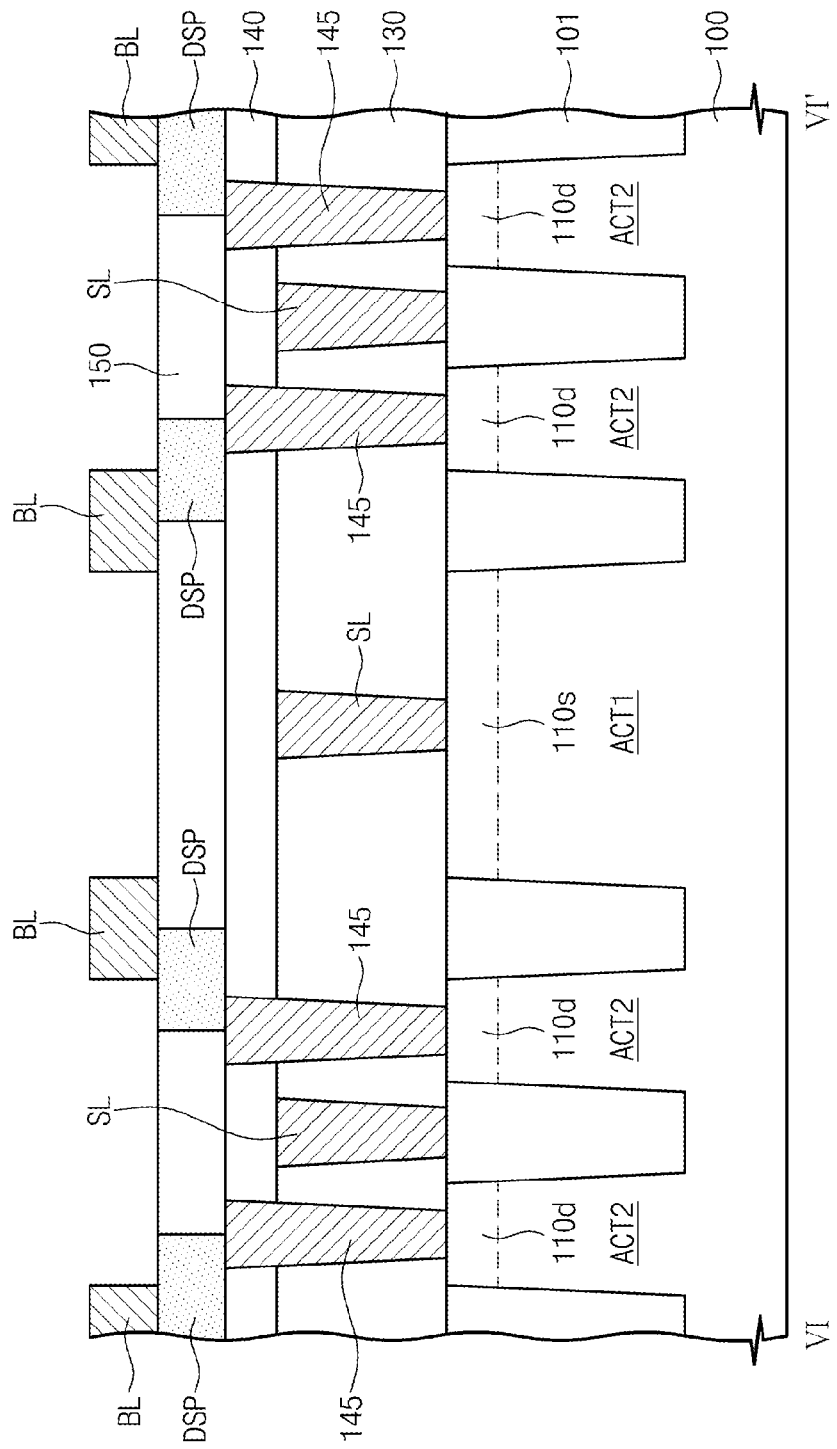
FIG. 10 is a cross-sectional view taken along a line VI-VI' of FIG. 9.
Figure 11:
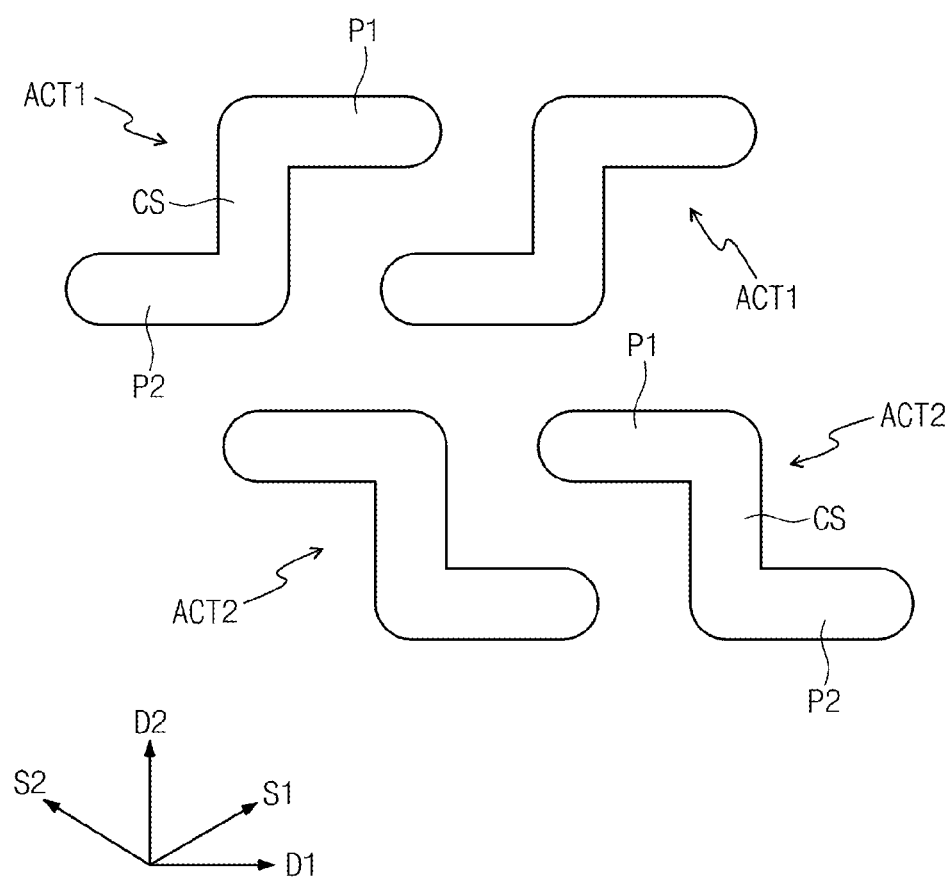
FIG. 11 is a plan view illustrating active patterns of a semiconductor memory device according to example embodiments of inventive concepts.

FIG. 9 is a plan view illustrating a semiconductor memory device according to example embodiments of inventive concepts. FIG. 10 is a cross-sectional view taken along a line VI-VI' of FIG. 9. FIG. 11 is a plan view illustrating active patterns of a semiconductor memory device according to example embodiments of inventive concepts.

Referring to FIGS. 9 and 10, a device isolation layer 101 may be formed in a semiconductor substrate 100 to define first and second active patterns ACT1 and ACT2. The first active patterns ACT1 may be arranged along a first direction D1 to constitute a first row, and the second active patterns ACT2 may be arranged along the first direction D2 to constitute a second row. The first row may be provided in plurality, and the second row may also be provided in plurality. The first rows and the second rows may be alternately arranged in a second direction D2.

As illustrated in FIG. 11, each of the first active patterns ACT1 may include a first portion P1, a second portion P2, and a connecting portion CS. The first and second portions P1 and P2 may be parallel to the first direction D1. The connecting portion CS may be parallel to the second direction D2 perpendicular to the first direction D1 and may connect the first portion P1 to the second portion P2. Here, an end of the first portion P1 may be spaced apart from an end of the second portion P2 in a first diagonal direction S1. The first diagonal direction S1 may be non-parallel to the first and second directions D1 and D2. Each of the second active patterns ACT2 may include a first portion P1, a second portion P2, and a connecting portion CS, as illustrated in FIG. 11. The first and second portions P1 and P2 of the second active pattern ACT2 may be parallel to the first direction D1. The connecting portion CS of the second active pattern ACT2 may be parallel to the second direction D2 and may connect the first portion P1 to the second portion P2 of the second active pattern ACT2. Here, an end of the first portion P1 of the second active pattern ACT2 may be spaced apart from an end of the second portion P2 of the second active pattern ACT2 in a second diagonal direction S2. The second diagonal direction S2 may be non-parallel to the first and second directions D1 and D2 and may be different from the first diagonal direction S1. In example embodiments, shapes of the first and second active patterns ACT1 and ACT2 may be substantially symmetrical.

Referring to FIGS. 9, 10, and 11, word lines WLa and WLb may extend in the second direction D2. Odd-numbered word lines WLa may intersect the second portions P2 of the first and second active patterns ACT1 and ACT2, and even-numbered word lines WLb may intersect the first portions P1 of the first and second active patterns ACT1 and ACT2. Each of the odd-numbered word lines WLa may extend between the first portions P1 of the second active patterns ACT2, and each of the even-numbered word lines WLb may extend between the second portions P2 of the first active patterns ACT1.

According to example embodiments, drain regions 110d may be formed in the first and second portions P1 and P2 of the first and second active patterns ACT1 and ACT2, respectively, and common source regions 110s may be formed in the connection portions CS of the first and second active patterns ACT1 and ACT2, respectively. The drain regions 110d and the common source regions 110s may be doped with dopants having a second conductivity type different from the first conductivity type of the first and second active regions ACT1 and ACT2. One of the first and second conductivity types may be an N-type, and the other of the first and second conductivity types may be a P-type.

A first interlayer insulating layer 130 may be disposed on an entire top surface of the semiconductor substrate 100, and source lines SL may be formed in the first interlayer insulating layer 130. The source lines SL may extend in the first direction D1. Each of the source lines SL may intersect the connection portions CS of the first or second active patterns ACT1 or ACT2 arranged in the first direction D1. Each of the source lines SL may be connected in common to the common source regions 110s of the first or second active patterns ACT1 or ACT2 arranged in the first direction D1.

Each of the source lines SL may be disposed between the first portions P1 and the second portions P2 of the first active patterns ACT1 arranged in the first direction D1 or between the first portions P1 and the second portions P2 of the second active patterns ACT2 arranged in the first direction D1 when viewed from a plan view. The source lines SL may be in direct contact with the common source regions 110s, and top surfaces of the source lines SL may be substantially coplanar with a top surface of the first interlayer insulating layer 130.

A second interlayer insulating layer 140 may be disposed on an entire top surface of the first interlayer insulating layer 130. The second interlayer insulating layer 140 may cover the top surfaces of the source lines SL. Contact plugs 145 may penetrate the second and first interlayer insulating layers 140 and 130 so as to be connected to the drain regions 110d, respectively.

Data storing patterns DSP may be disposed on the contact plugs 145, respectively. Each of the data storing patterns DSP may be in contact with a portion of the contact plug 145.

In example embodiments, a third interlayer insulating layer 150 may fill a space between the data storing patterns DSP and may have a top surface which is substantially coplanar with top surfaces of the data storing patterns DSP.

Bit lines BL may be disposed on the data storing patterns DSP and the third interlayer insulating layer 150 and may intersect the word lines WLa and WLb. The bit lines BL may be parallel to the source lines BL. Each of the bit lines BL may be disposed between the source lines SL adjacent to each other when viewed from a plan view. Each of the bit lines BL may be connected in common to the data storing patterns DSP which are arranged in a zigzag form along the first direction D1 and are electrically connected to the drain regions 110d of the first and second active regions ACT1 and ACT2.

FIGS. 12A to 12F are diagrams illustrating various embodiments of a data storage pattern of a semiconductor memory device according to example embodiments of inventive concepts.

Figure 12A:
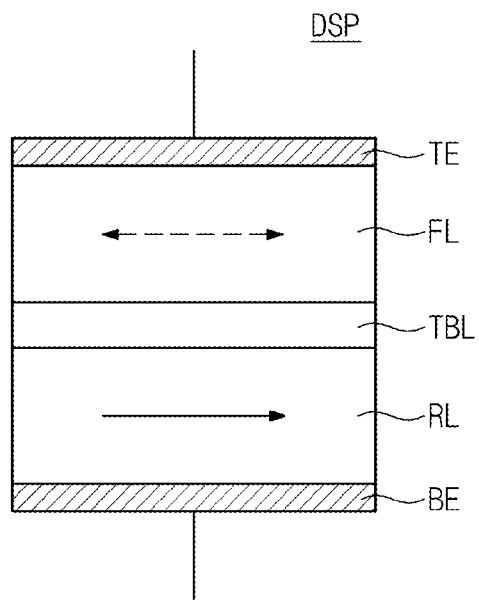
FIGS. 12A to 12F are diagrams illustrating various embodiments of a data storage pattern of a semiconductor memory device according to example embodiments of inventive concepts.
Figure 12B:
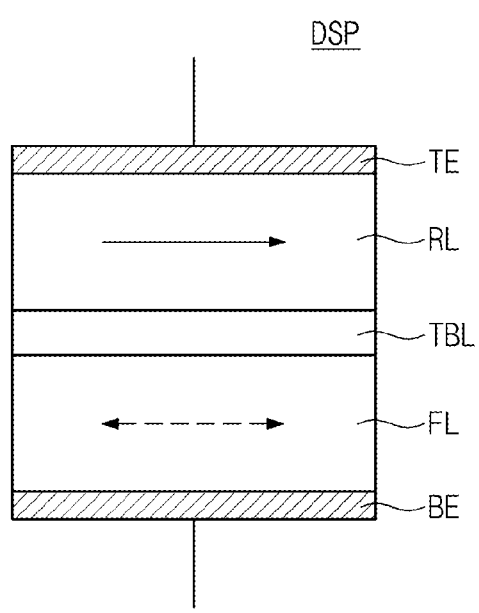

According to example embodiments illustrated in FIGS. 12A and 12B, a data storing pattern DSP may include a reference magnetic layer RL, a free magnetic layer FL, and a tunnel barrier layer TBL disposed between the reference magnetic layer RL and the free magnetic layer FL. The reference magnetic layer RL may have a magnetization direction fixed in one direction, and the free magnetic layer FL may have a changeable magnetization direction. The magnetization direction of the free magnetic layer FL can be changed into a direction parallel or anti-parallel to the magnetization direction of the reference magnetic layer RL by a program operation. The magnetization direction of the reference magnetic layer RL and the free magnetic layer FL may be parallel to a top surface of the tunnel barrier layer TBL. The reference magnetic layer RL, the tunnel barrier layer TBL, and the free magnetic layer FL may constitute a magnetic tunnel junction (MTJ).

An electrical resistance of the MTJ may be much greater when the magnetization directions of the reference and free magnetic layers RL and FL are anti-parallel to each other than when they are parallel to each other. In other words, the electrical resistance of the MTJ may be controlled by changing the magnetization direction of the free magnetic layer FL. The magnetization direction of the free magnetic layer FL may be changed using spin torque of electrons in a write current. As a result, the data storing pattern DSP including the MTJ may store data by means of an electrical resistance difference occurring by the magnetization directions of the MTJ.

Each of the reference and free magnetic layers RL and FL may include a ferromagnetic material. The reference magnetic layer RL may further include an anti-ferromagnetic material pinning the magnetization direction of the ferromagnetic material included in the reference magnetic layer RL. The tunnel barrier layer TBL may include at least one of magnesium oxide, titanium oxide, aluminum oxide, magnesium-zinc oxide, or magnesium-boron oxide.

The data storing pattern DSP may further include a bottom electrode BE and a top electrode TE. The reference magnetic layer RL, the tunnel barrier layer TBL, and the free magnetic layer FL may be disposed between the bottom electrode BE and the top electrode TE. As illustrated in FIG. 12A, the reference magnetic layer RL may be disposed between the bottom electrode BE and the tunnel barrier layer TBL, and the free magnetic layer FL may be disposed between the top electrode TE and the tunnel barrier layer TBL. Alternatively, as illustrated in FIG. 12B, the free magnetic layer FL may be disposed the bottom electrode BE and the tunnel barrier layer TBL, and the reference magnetic layer RL may be disposed between the top electrode TE and the tunnel barrier layer TBL. Each of the bottom and top electrodes BE and TE may include a conductive metal nitride (e.g., titanium nitride, tantalum nitride, and/or tungsten nitride).

Figure 12C:
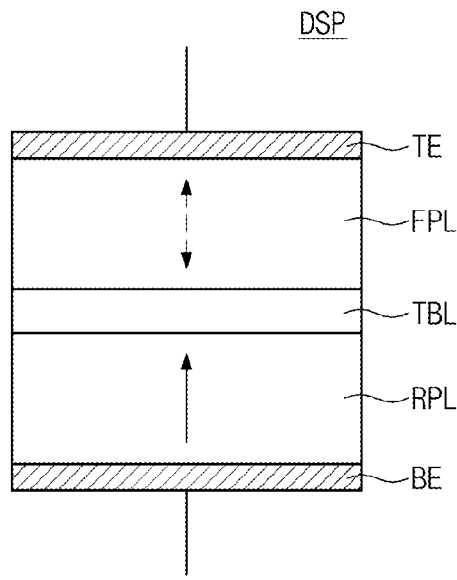

According to example embodiments illustrated in FIG. 12C, a data storing pattern DSP may include a reference perpendicular magnetic layer RPL, a free perpendicular magnetic layer FPL, and a tunnel barrier layer TBL disposed between the reference perpendicular magnetic layer RPL and the free perpendicular magnetic layer FPL. The reference perpendicular magnetic layer RPL may have a magnetization direction fixed in one direction, and the free perpendicular magnetic layer FPL may have a changeable magnetization direction. The magnetization direction of the free perpendicular magnetic layer FPL can be changed into a direction parallel or anti-parallel to the magnetization direction of the reference perpendicular magnetic layer RPL by a program operation. The magnetization direction of the reference perpendicular magnetic layer RPL and the free perpendicular magnetic layer FPL may be substantially perpendicular to a top surface of the tunnel barrier layer TBL.

Each of the reference perpendicular magnetic layer RPL and the free perpendicular magnetic layer FPL may include a perpendicular magnetic material (e.g., CoFeTb, CoFeGd, or CoFeDy), a perpendicular magnetic material having a L10 structure, or CoPt having a hexagonal close packed (HCP) lattice structure. The perpendicular magnetic material having the L10 structure may include at least one of FePt of the L10 structure, FePd of the L10 structure, CoPd of the L10 structure, or CoPt of the L10 structure.

In example embodiments, each of the reference perpendicular magnetic layer RPL and the free perpendicular magnetic layer FPL may include magnetic layers and non-magnetic layers that are alternately and repeatedly stacked. For example, each of the reference perpendicular magnetic layer RPL and the free perpendicular magnetic layer FPL may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes a natural number. Here, the reference perpendicular magnetic layer RPL may be thicker than the free perpendicular magnetic layer FPL and/or a coercive force of the reference perpendicular magnetic layer RPL may be greater than a coercive force of the free perpendicular magnetic layer FPL.

The tunnel barrier layer TBL may include at least one of magnesium oxide, titanium oxide, aluminum oxide, magnesium-zinc oxide, or magnesium-boron oxide.

In the embodiment of FIG. 12C, the data storing pattern DSP may further include a bottom electrode BE and a top electrode TE. The bottom and top electrodes BE and TE may be formed of a conductive metal nitride. The reference perpendicular magnetic layer RPL, the tunnel barrier layer TBL, and the free perpendicular magnetic layer FPL may be sequentially stacked between the bottom electrode BE and the top electrode TE. Alternatively, the positions of the reference perpendicular magnetic layer RPL and the free perpendicular magnetic layer FL may be reversed. In other words, the free perpendicular magnetic layer FPL, the tunnel barrier layer TBL, and the reference perpendicular magnetic layer RPL may be sequentially stacked between the bottom electrode BE and the top electrode TE.

Figure 12D:
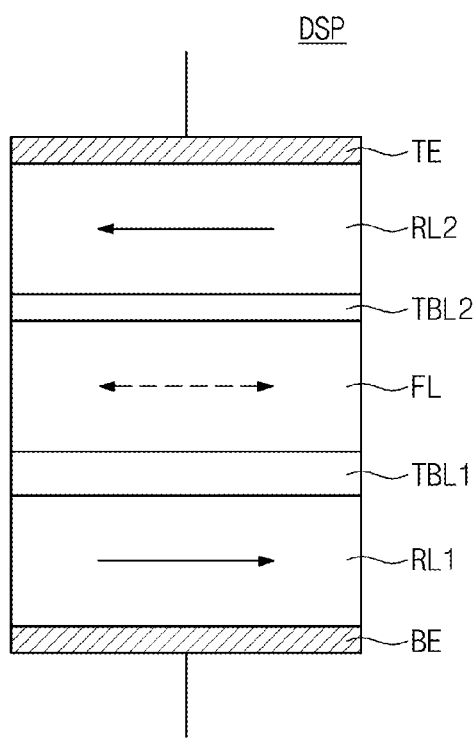

According to example embodiments illustrated in FIG. 12D, a data storing pattern DSP may include a first magnetic tunnel junction (MTJ) pattern and a second magnetic tunnel junction (MTJ) pattern.

Referring to FIG. 12D, in more detail, the data storing pattern DSP may include a first reference magnetic layer RL1, a first tunnel barrier layer TBL1, a free magnetic layer FL, a second tunnel barrier layer TBL2, and a second reference magnetic layer RL2 which are sequentially stacked. A thickness of the first tunnel barrier layer TBL1 may be different from a thickness of the second tunnel barrier layer TBL2. The first reference magnetic layer RL1, the first tunnel barrier layer TBL1, and the free magnetic layer FL may constitute the first MTJ pattern. The free magnetic layer FL, the second tunnel barrier layer TBL2, and the second reference magnetic layer RL2 may constitute the second MTJ pattern.

The first and second reference magnetic layers RL1 and RL2 may have fixed (or pinned) magnetization directions. Here, the magnetization direction of the first reference magnetic layer RL1 may be anti-parallel to the magnetization direction of the second reference magnetic layer RL2. The free magnetic layer FL may have a changeable magnetization direction in parallel or anti-parallel to the fixed magnetization directions of the first and second reference magnetic layers RL1 and RL2. The magnetization directions of the free magnetic layer FL and the first and second reference magnetic layers RL1 and RL2 may be substantially parallel or perpendicular to top surfaces of the first and second tunnel barrier layers TBL1 and TBL2.

The data storing pattern DSP may further include a bottom electrode BE and a top electrode TE. The bottom and top electrodes BE and TE may be formed of a conductive metal nitride. The first reference magnetic layer RL1, the first tunnel barrier layer TBL1, the free magnetic layer FL, the second tunnel barrier layer TBL2, and the second reference magnetic layer RL2 may be sequentially stacked between the bottom electrode BE and the top electrode TE.

Figure 12E:
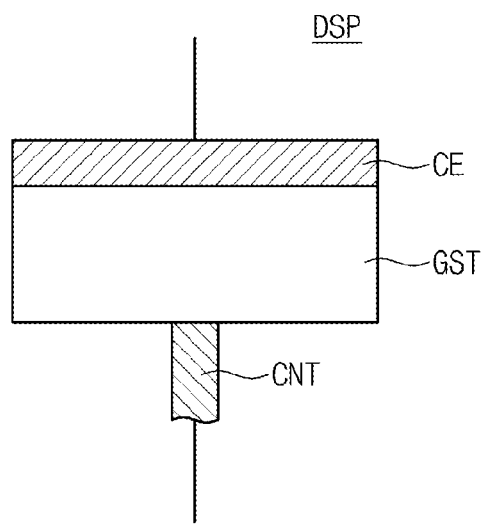

According to example embodiments illustrated in FIG. 12E, a data storing pattern DSP may include a phase-change material pattern GST and a capping electrode CE which are sequentially stacked. A phase of the phase-change material pattern GST may be changed into a crystalline state or an amorphous state by means of a temperature and a supplying time of heat applied to the phase-change material pattern GST. A specific resistance value of the phase-change material pattern GST in the crystalline state may be lower than that of the phase-change material pattern GST in the amorphous state. The data storing pattern DSP may store data by means of a difference between the specific resistance values of the phase-change material pattern GST. According to example embodiments, a cell contact plug CNT that is in contact with the phase-change material pattern GST may be used as a heater electrode. In this case, a portion of the phase-change material pattern GST that is adjacent to the cell contact plug CNT may correspond to a program region. A phase of the program region may be changed into the crystalline state or the amorphous state.

The phase-change material pattern GST may include at least one of tellurium (Te) and selenium (Se) that are chalcogenide elements. For example, the phase-change material pattern GST may include at least one of Ge—Sb—Te, As—Sb—Te, As—Ge—Sb—Te, Sn—Sb—Te, Ag—In—Sb—Te, In—Sb—Te, 5A group element-Sb—Te, 6A group element-Sb—Te, 5A group element-Sb—Se, 6A group element-Sb—Se, Ge—Sb, In—Sb, Ga—Sb, or a doped Ge—Sb—Te. The doped Ge—Sb—Te may be doped with C, N, B, Bi, Si, P, Al, Dy, or Ti. Each of the capping electrode CE and the cell contact plug CNT may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

Figure 12F:
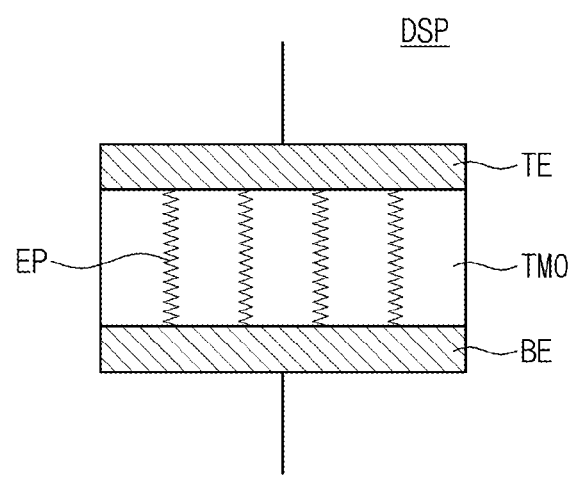
Figure 13A:
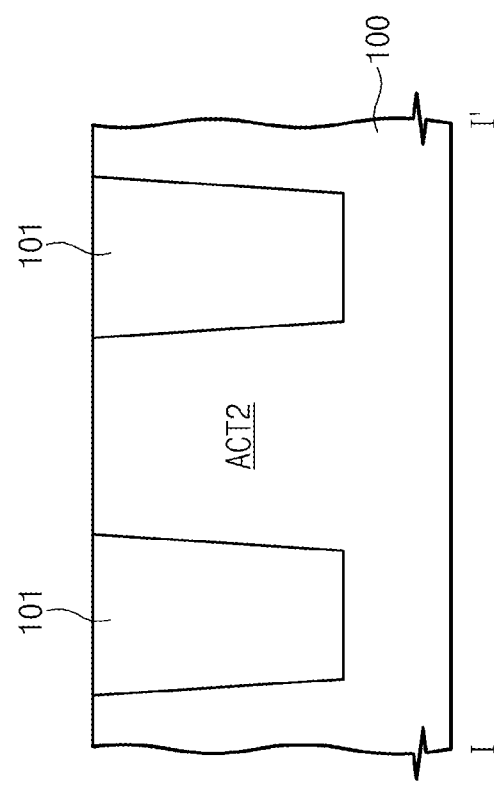
Figure 13B:
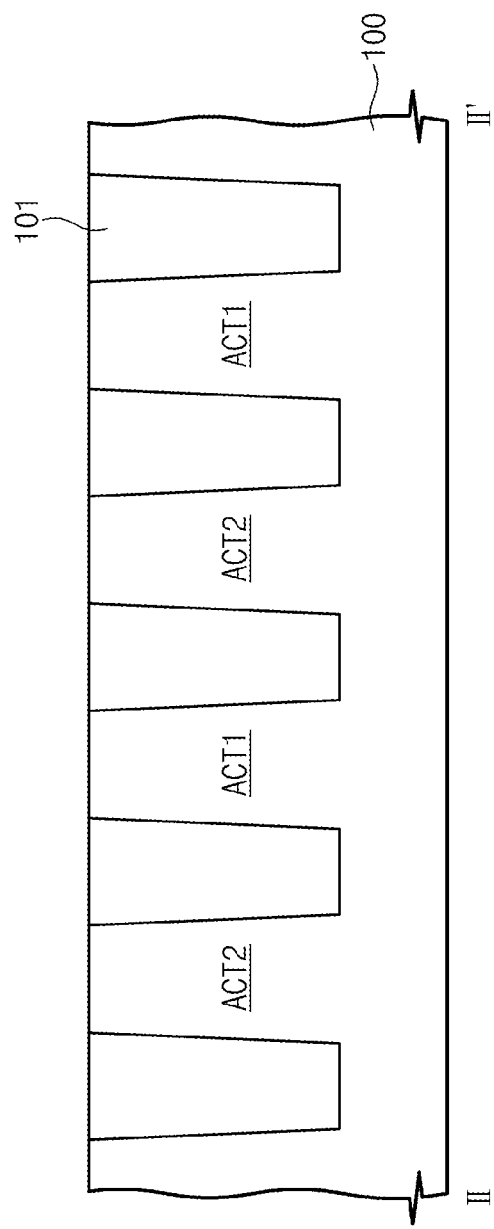
Figure 13C:
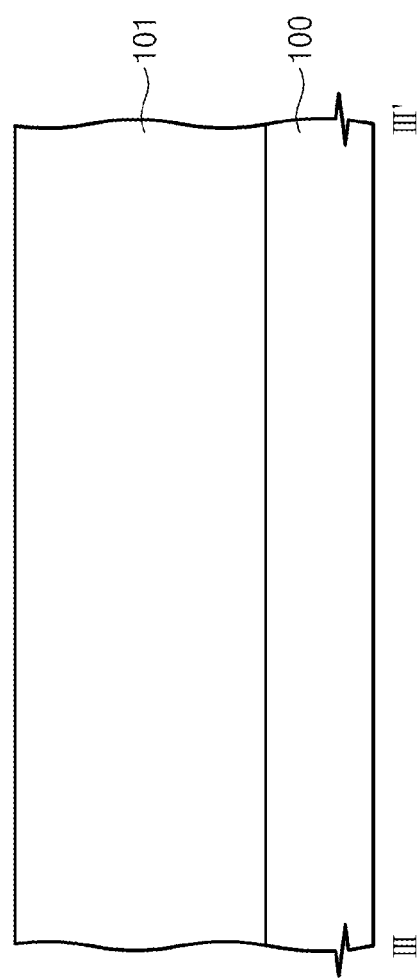
Figure 14A:
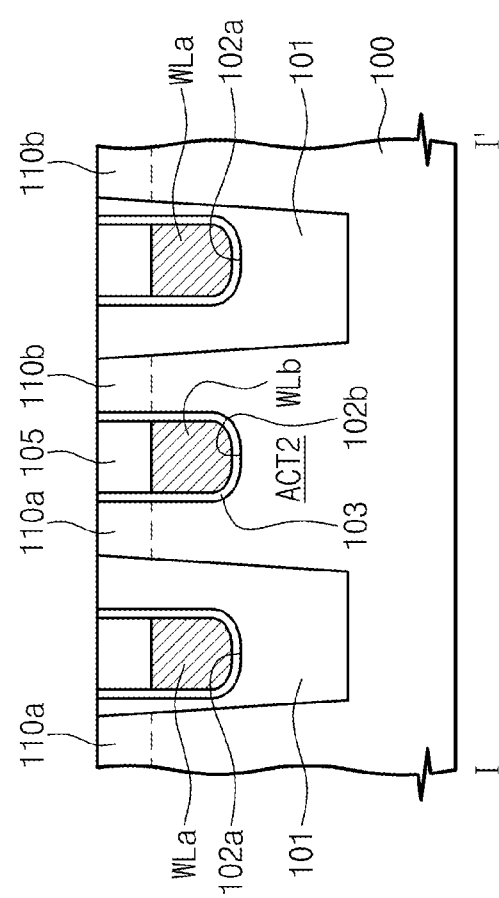
Figure 14B:
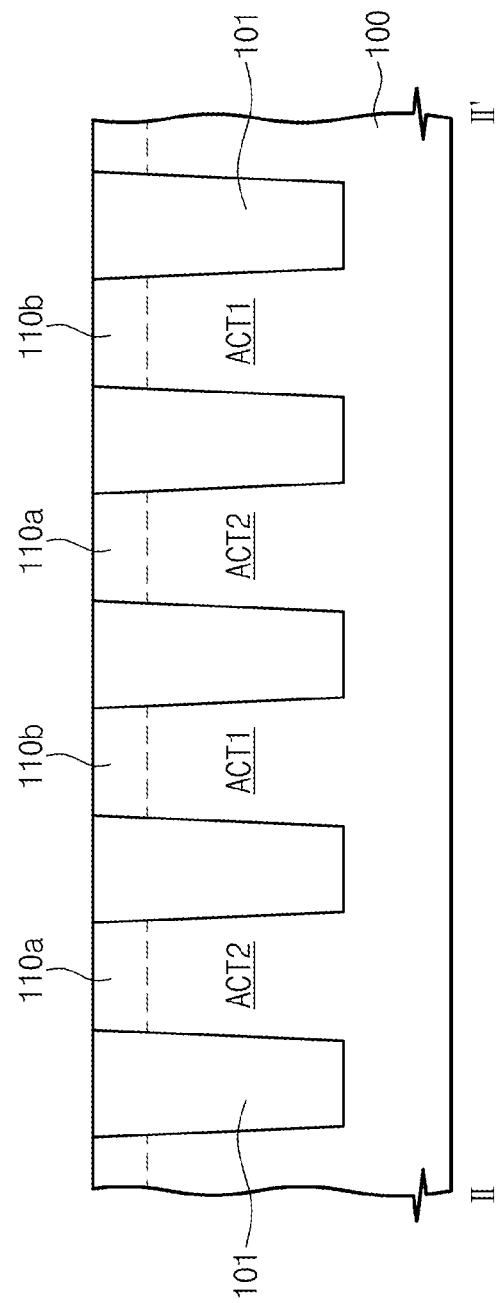
Figure 14C:
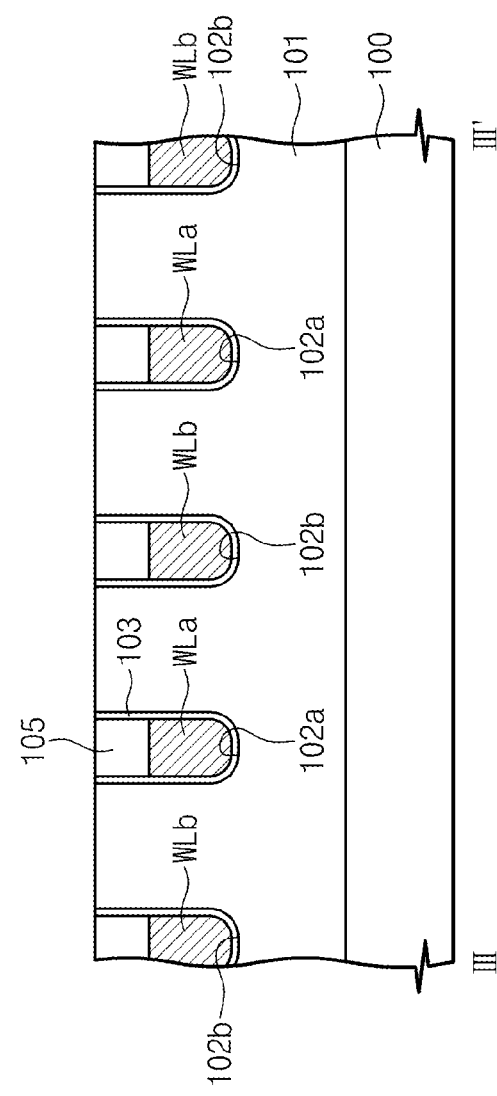
Figure 15A:
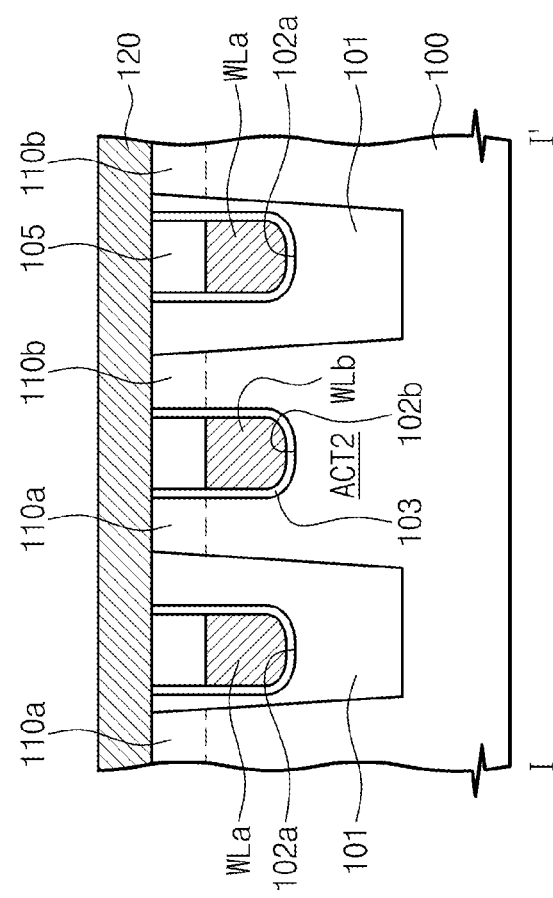
Figure 15B:
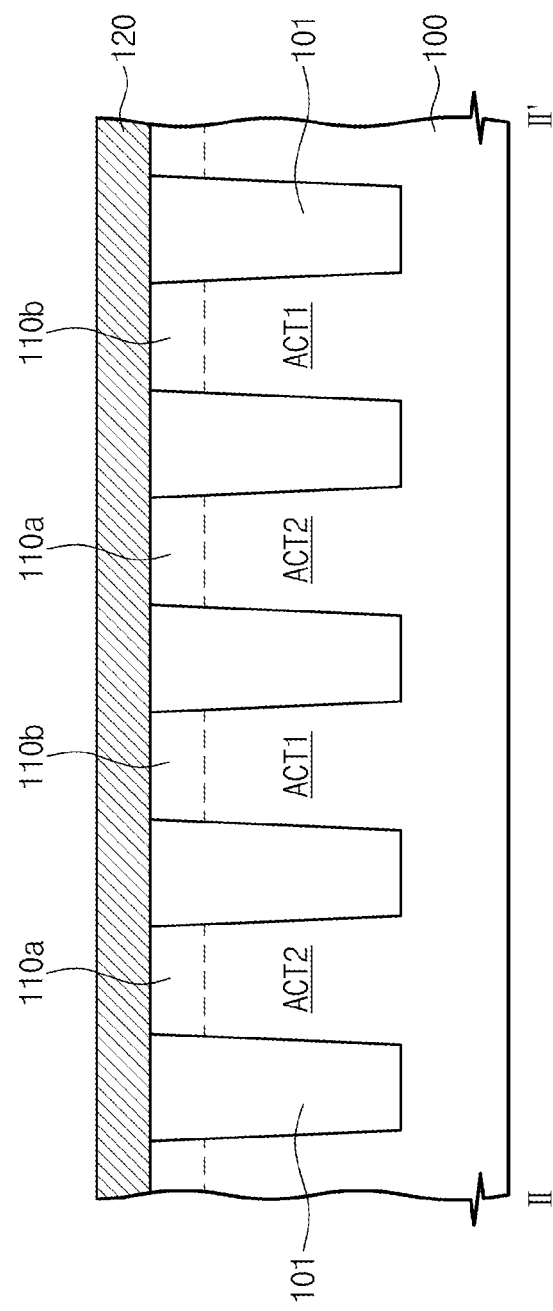
Figure 15C:
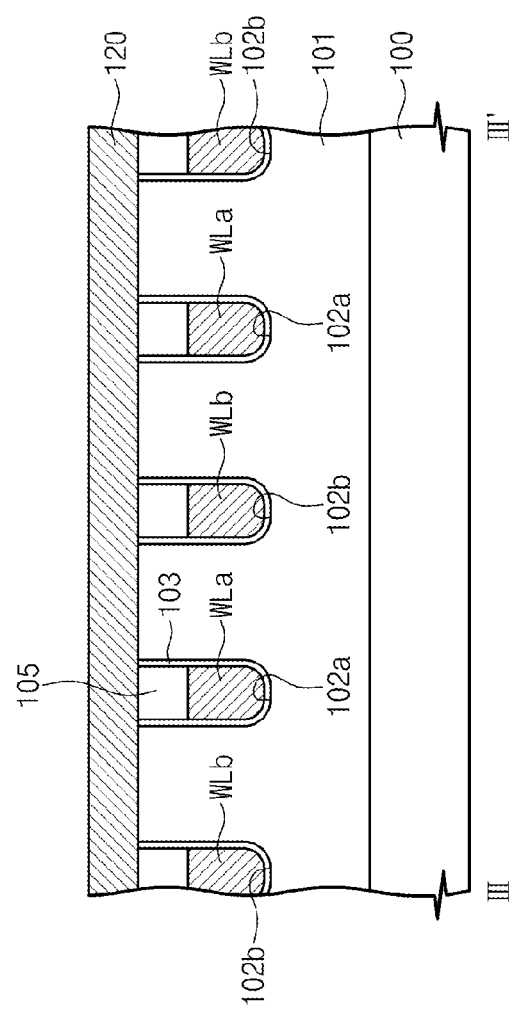
Figure 16A:
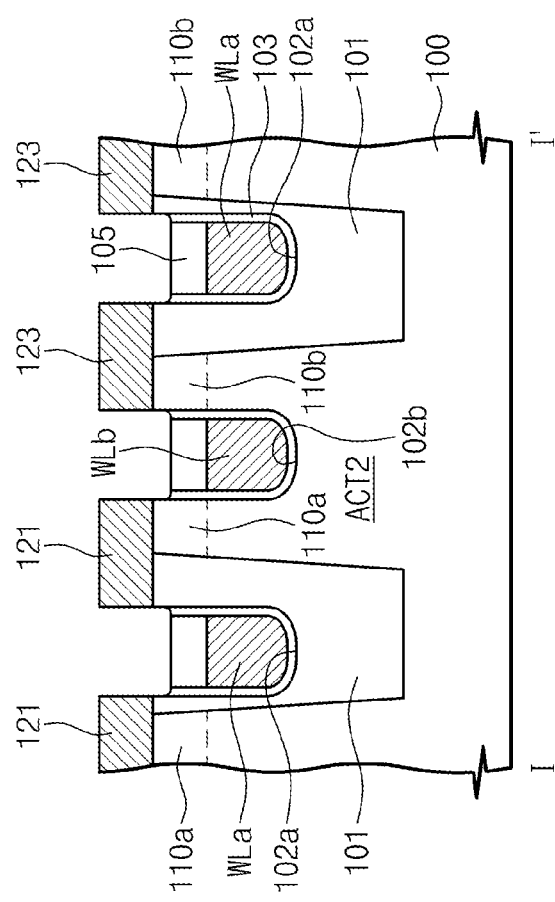
Figure 16B:
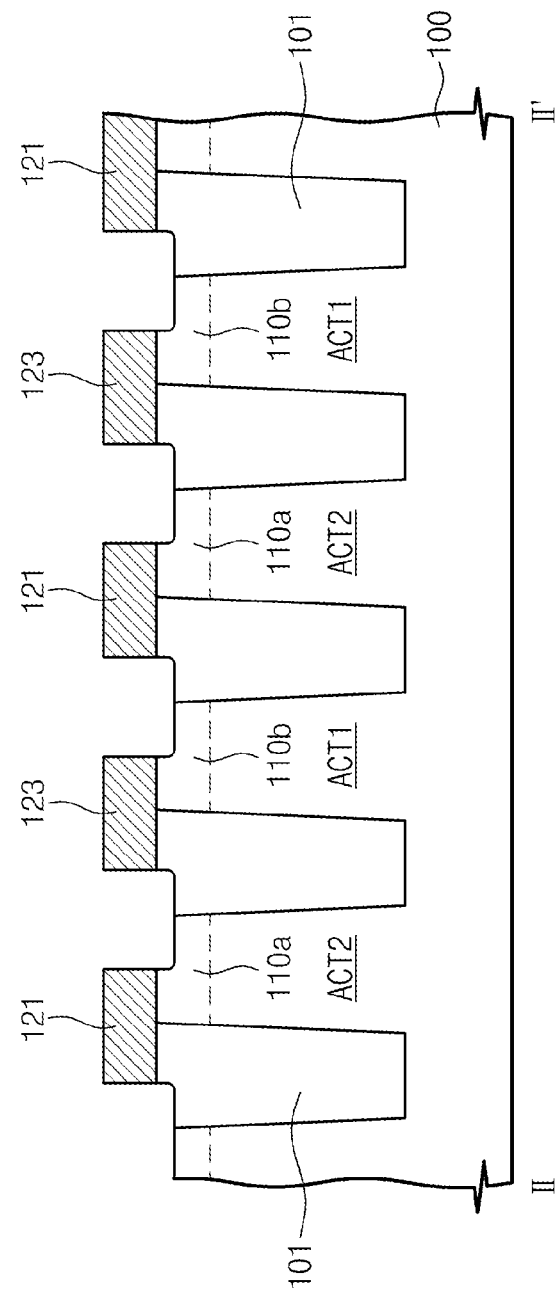
Figure 16C:
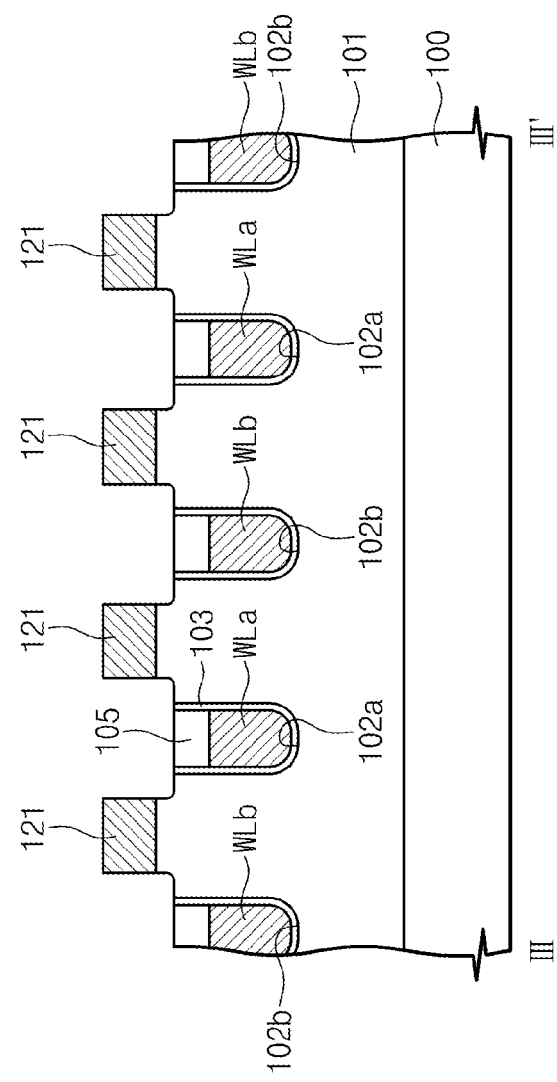
Figure 17A:
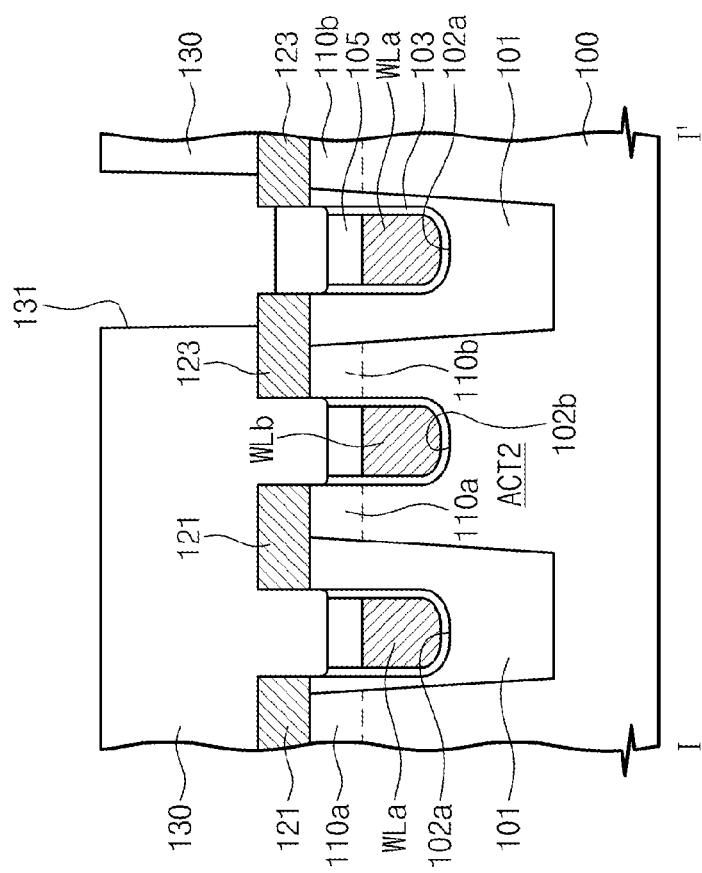
Figure 17B:
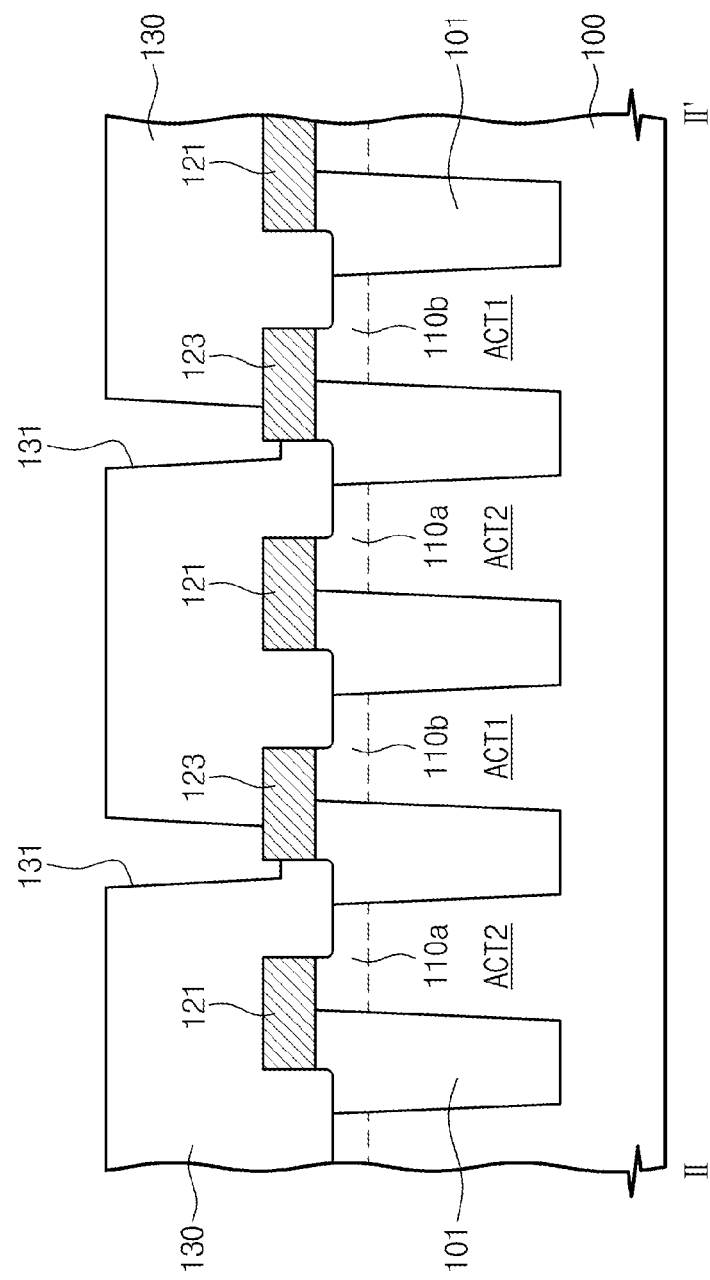
Figure 17C:
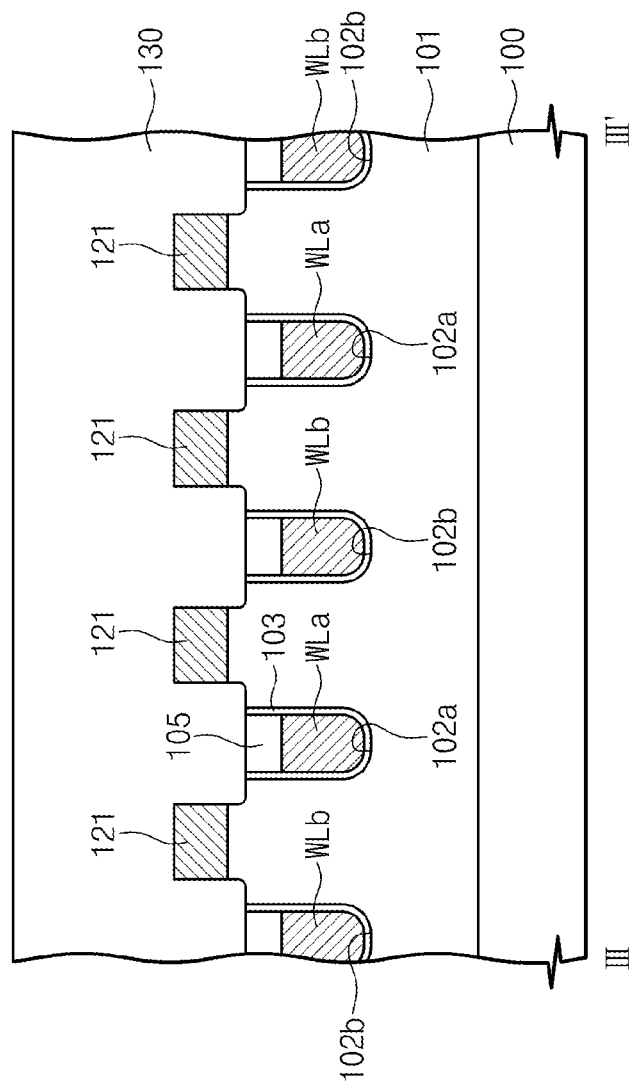
Figure 18A:
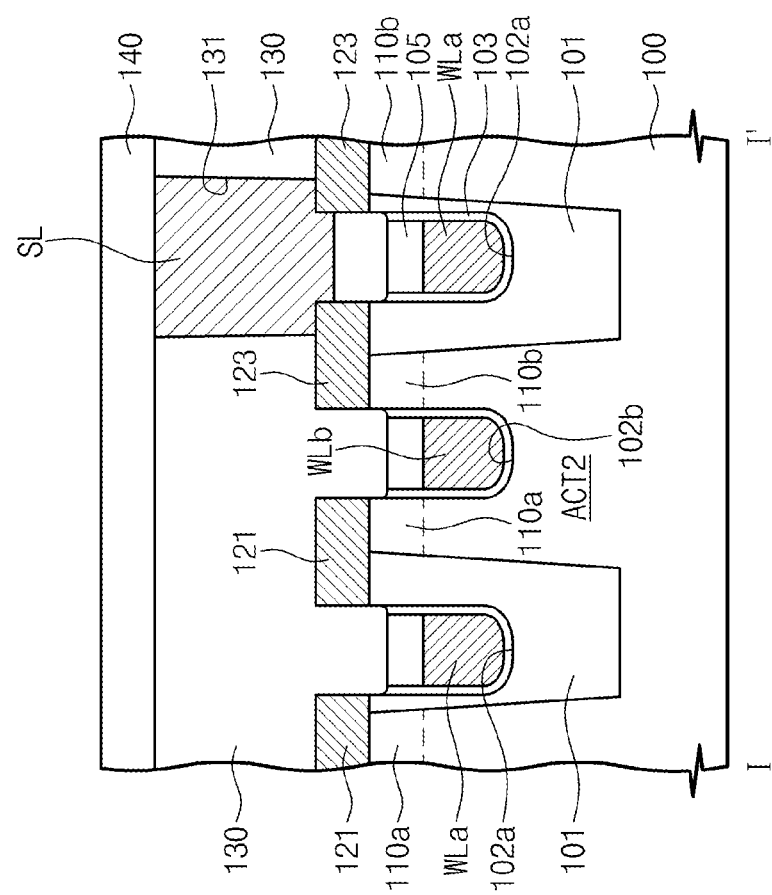
Figure 18B:
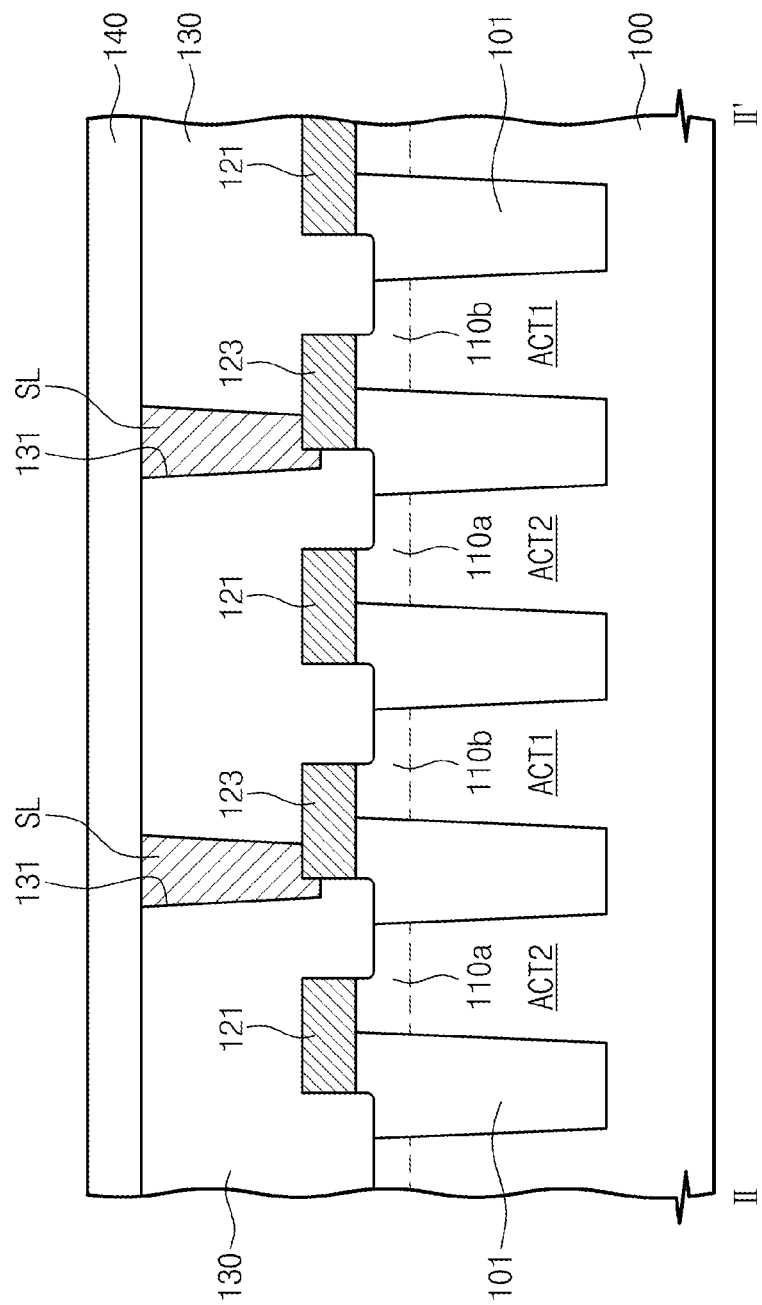
Figure 18C:
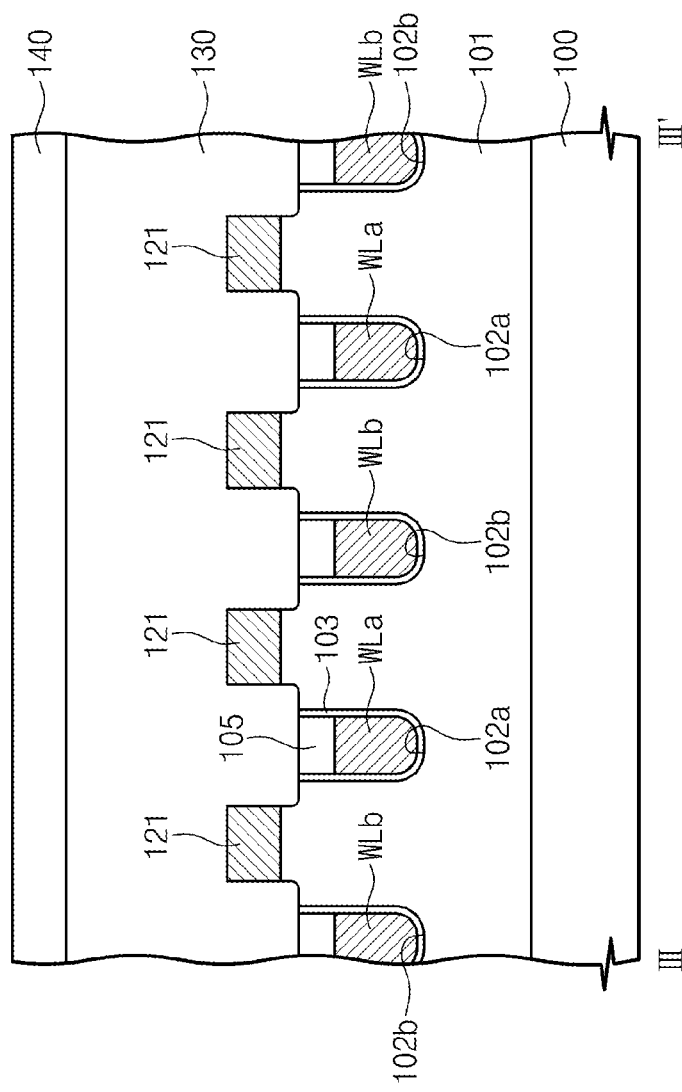
Figure 19A:
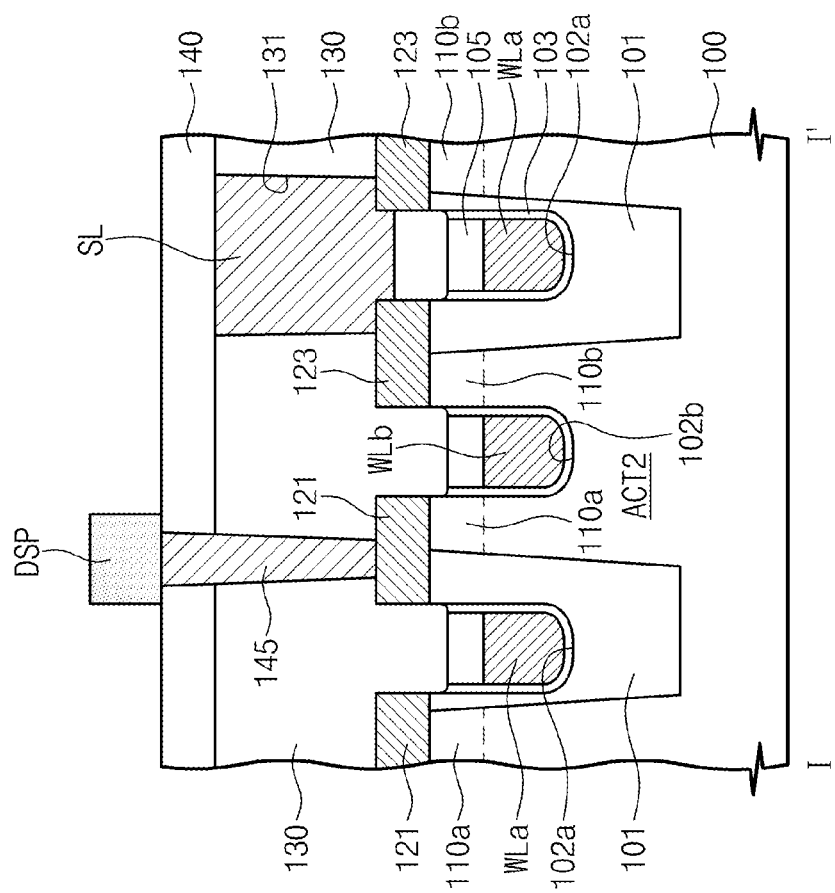
Figure 19B:
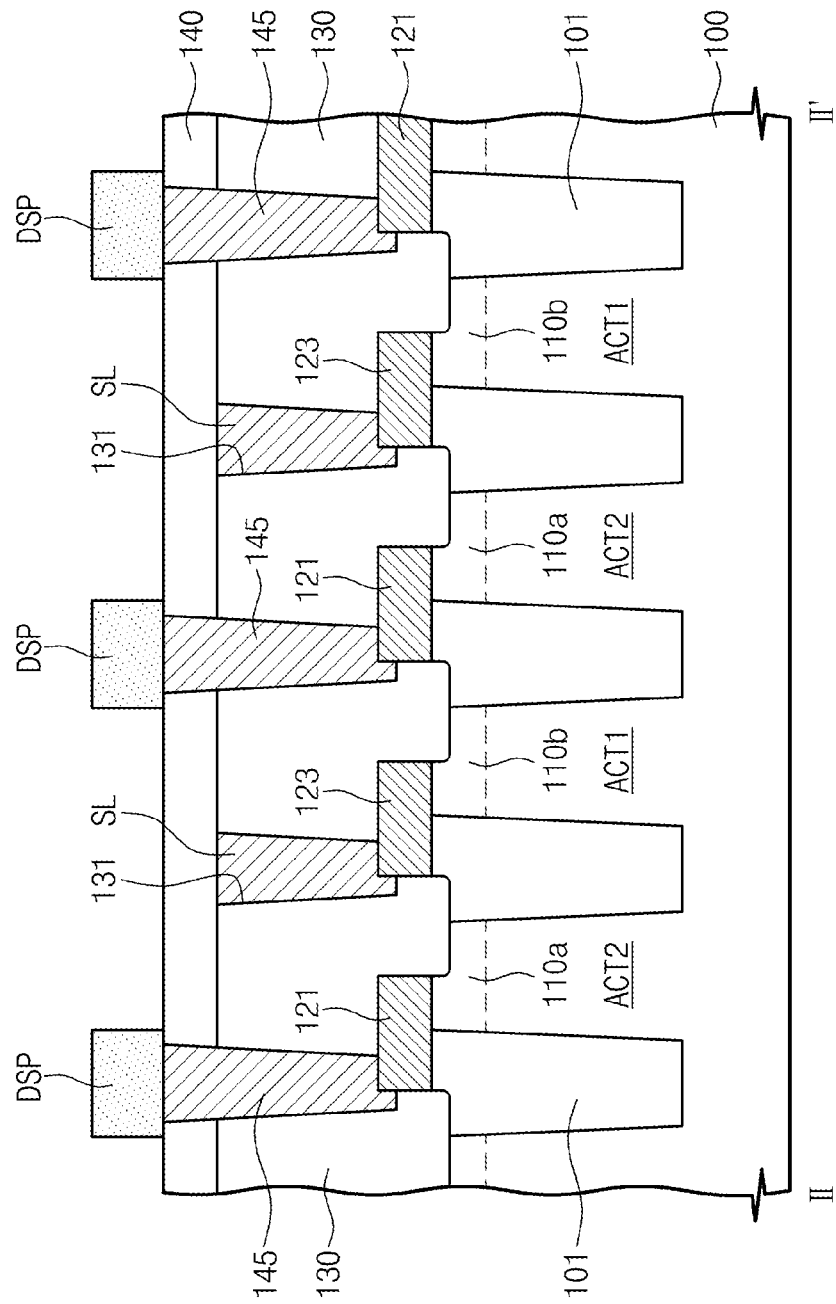
Figure 19C:
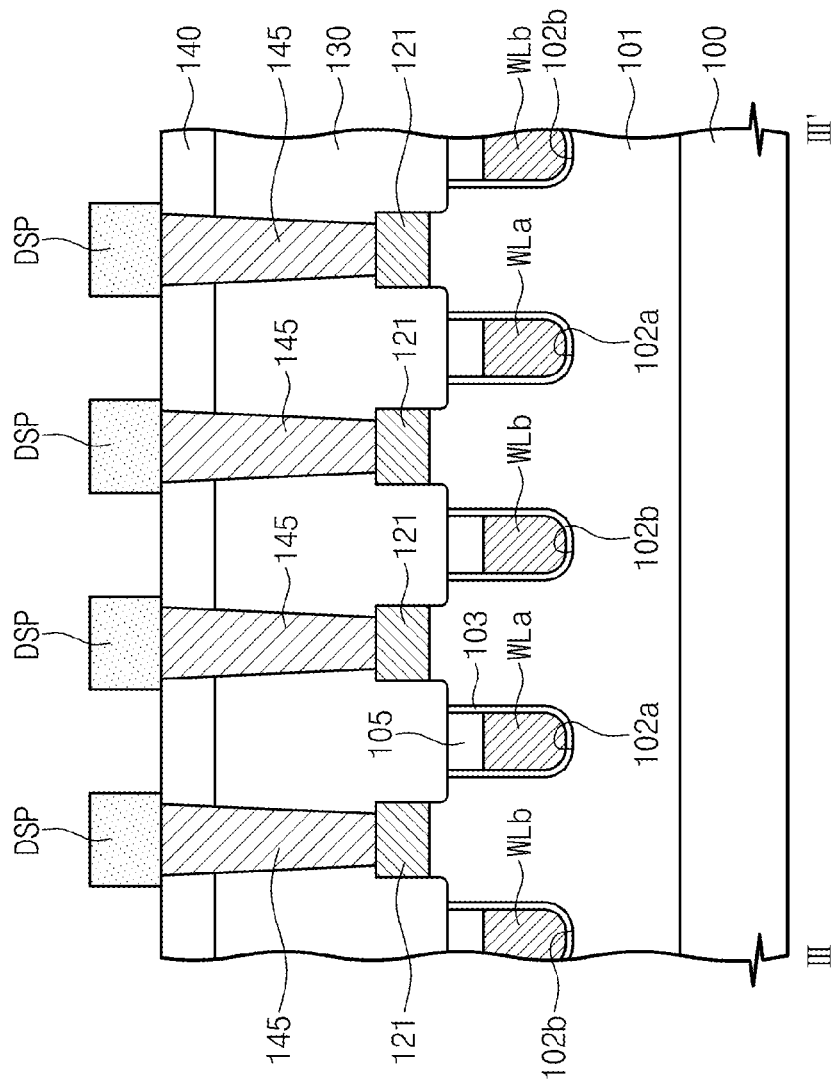

According to example embodiments illustrated in FIG. 12F, a data storing pattern DSP may include a bottom electrode BE, a top electrode TE, and a transition metal oxide pattern TMO disposed between the bottom electrode BE and top electrode TE. At least one electrical path EP may be generated in or removed from the transition metal oxide pattern TMO by a program operation. Both ends of the electrical path may be connected to the bottom electrode BE and the top electrode TE, respectively. If the electrical path EP is generated in the transition metal oxide pattern TMO, the data storing pattern DSP may have a low resistance value. If the electrical path EP is removed from the transition metal oxide pattern TMO, the data storing pattern DSP may have a high resistance value. The data storing pattern DSP may store data by means of a resistance value difference caused by the electrical path EP.

For example, the transition metal oxide pattern TMO may include at least one of niobium oxide, titanium oxide, nickel oxide, zirconium oxide, vanadium oxide, (Pr,Ca)MnO3 (PCMO), strontium-titanium oxide, barium-strontium-titanium oxide, strontium-zirconium oxide, barium-zirconium oxide, or barium-strontium-zirconium oxide.

Each of the bottom and top electrodes BE and TE may include at least one of a conductive metal nitride (e.g., titanium nitride or tantalum nitride), a transition metal (e.g., titanium or tantalum), or a rare-earth metal (e.g., ruthenium or platinum).

FIGS. 13A to 19A, 13B to 19B, and 13C to 19C are cross-sectional views illustrating a method of manufacturing a semiconductor memory device according to example embodiments of inventive concepts. FIGS. 13A to 19A are cross-sectional views taken along the line I-I' of FIG. 3, FIGS. 13B to 19B are cross-sectional views taken along the line II-II' of FIG. 3, and FIGS. 13C to 19C are cross-sectional views taken along the line III-III' of FIG. 3.

Referring to FIGS. 3, 13A, 13B, and 13C, a device isolation layer 101 may be formed in a semiconductor substrate 100 to define first active patterns ACT1 and second active patterns ACT2.

The semiconductor substrate 100 may be formed of a single-crystalline semiconductor material. For example, the semiconductor substrate 100 may be a silicon substrate, a silicon-on-insulator (SOI) substrate, a germanium substrate, a germanium-on-insulator (GOI) substrate, a silicon-germanium substrate, or a substrate including a epitaxial layer formed by performing a selective epitaxial growth (SEG) process.

The semiconductor substrate 100 may be patterned to form a trench, and the trench may be filled with an insulating layer. The insulating layer may be planarized unit a top surface of the semiconductor substrate 100 is exposed, thereby forming the device isolation layer 101.

In example embodiments, the first and second active patterns ACT1 and ACT2 may be two-dimensionally arranged along a first direction D1 and a second direction D2. Each of the first and second active patterns ACT1 and ACT2 may have a rectangular shape (or a bar shape) of which a long axis is parallel to the first direction D1. The first active patterns ACT1 and the second active patterns ACT2 may be alternately arranged in the second direction D2, and the second active patterns ACT2 may be respectively spaced apart from the first active patterns ACT1 in a diagonal direction.

Referring to FIGS. 3, 14A, 14B, and 14C, the first and second active patterns ACT1 and ACT2 and the device isolation layer 101 may be patterned to form first and second gate recess regions 102a and 102b extending in the second direction D2. The first and second gate recess regions 102a and 102b may be alternately arranged in the first direction D1. Bottom surfaces of the first and second gate recess regions 102a and 102b may be higher than a bottom surface of the device isolation layer 101.

Each of the first gate recess regions 102a may intersect the first active patterns ACT1 arranged in the second direction D2 and may be disposed between the second active patterns ACT2 adjacent to each other in the first direction D1. Each of the second gate recess regions 102b may intersect the second active patterns ACT2 arranged in the second direction D2 and may be disposed between the first active patterns ACT1 adjacent to each other in the first direction D1.

Next, a gate dielectric layer 103 may be formed to conformally cover inner surfaces of the first and second gate recess regions 102a and 102b. A conductive layer may be deposited to fill the first and second gate recess regions 102a and 102b having the gate dielectric layer 103, and the deposited conductive layer may be etched to form word lines WLa and WLb in the first and second gate recess regions 102a and 102b, respectively. At this time, top surfaces of the word lines WLa and WLb may be lower than a top surface of the device isolation layer 101.

Gate hard mask patterns 105 may be formed in the first and second gate recess regions 102a and 102b on the word lines WLa and WLb. A hard mask layer may be deposited to fill the first and second gate recess regions 102a and 102b having the word lines WLa and WLb, and the deposited hard mask layer may be planarized until the top surface of the semiconductor substrate 100 is exposed, thereby forming the gate hard mask patterns 105.

Dopants may be injected into the first and second active patterns ACT1 and ACT2 at both sides of each of the word lines WLa and WLb to form first and second dopant regions 110a and 110b. According to example embodiments, one of the first dopant regions 110a and one of the second dopant regions 110b may be formed in each of the first and second active patterns ACT1 and ACT2. A conductivity type of the first and second dopant regions 110a and 110b may be opposite to that of the first and second active patterns ACT1 and ACT2.

Referring to FIGS. 3, 15A, 15B, and 15C, a conductive layer 120 may be deposited on an entire top surface of the semiconductor substrate 100. In other words, the conductive layer 120 may cover the top surfaces of the first and second active patterns ACT1 and ACT2, the top surface of the device isolation layer 101, and the top surfaces of the gate hard mask patterns 105. In example embodiments, the conductive layer 120 may include at least one of, for example, a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

Referring to FIGS. 3, 16A, 16B, and 16C, mask patterns (not shown) may be formed on the conductive layer 120, and the conductive layer 120 may be anisotropically etched using the mask patterns as etch masks to form first and second conductive pads 121 and 123.

The first conductive pads 121 may be formed on the first dopant regions 110a of the first and second active patterns ACT1 and ACT2, respectively. The second conductive pads 123 may be formed on the second dopant regions 110b of the first and second active patterns ACT1 and ACT2, respectively. The first conductive pads 121 may be spaced apart from the second conductive pads 123 in a diagonal direction, respectively.

According to example embodiments, portions of the first and second active patterns ACT1 and ACT2, a portion of the device isolation layer 101, and the gate hard mask patterns 105 may be recessed by over-etching when the conductive layer 120 is anisotropically etched. In other words, portions of the top surfaces of the first and second active patterns, which are disposed between the first and second conductive pads 121 and 123, may be lower than bottom surfaces of the first and second conductive pads 121 and 123. In addition, top surfaces of the gate hard mask patterns 105 may also be lower than the bottom surfaces of the first and second conductive pads 121 and 123. As a result, since a residual conductive material remaining between the first and second conductive pads 121 and 123 is completely removed by the over-etching, it is possible to limit and/or prevent an electrical short which may be caused between the first and second active patterns ACT1 and ACT2 adjacent to each other by the residual conductive material.

Referring to FIGS. 3, 17A, 17B, and 17C, a first interlayer insulating layer 130 may be formed on the semiconductor substrate 100 having the first and second conductive pads 121 and 123. The first interlayer insulating layer 130 may fill a space between the first and second conductive pads 121 and 123 and may cover portions of the first and second dopant regions 110a and 110b. In example embodiments, an etch stop layer (not shown) may be conformally formed on surfaces of the first and second conductive pads 121 and 123 before the formation of the first interlayer insulating layer 130.

Subsequently, the first interlayer insulating layer 130 may be patterned to form trenches 131 extending in the first direction D1. Each of the trenches 131 may expose the second conductive pads 123 arranged in a zigzag form along the first direction D1. The first interlayer insulating layer 130 may be over-etched during an anisotropic etching process used for the formation of the trenches 131, so portions of sidewalls of the second conductive pads 123 may be exposed through the trench 131.

Referring to FIGS. 3, 18A, 18B, and 18C, a conductive layer may be deposited to fill the trenches 131. The deposited conductive layer may be planarized until a top surface of the first interlayer insulating layer 130 is exposed, thereby forming source lines SL in the trenches 131, respectively. Top surfaces of the source lines SL may be substantially coplanar with the top surface of the first interlayer insulating layer 130. Each of the source lines SL may be connected in common to the second dopant regions 110b of the first and second active patterns ACT1 and ACT2 through the second conductive pads 123. After the formation of the source lines SL, a second interlayer insulating layer 140 may be formed on the top surfaces of the source lines SL and the top surface of the first interlayer insulating layer 130.

Referring to FIGS. 3, 19A, 19B, and 19C, contact plugs 145 may be formed to be connected to the first conductive pads 121, respectively. The second and first interlayer insulating layers 140 and 130 may be patterned to form contact holes that expose the first conductive pads 121, respectively. A conductive layer may be deposited to fill the contact holes, and the deposited conductive layer may be planarized to form the contact plugs 145. In example embodiments, the contact plugs 145 may be in contact with portions of the first conductive pads 121, respectively.

Next, data storing patterns DSP may be formed on the second interlayer insulating layer 140. The data storing patterns DSP may be connected to the contact plugs 145, respectively. In example embodiments, the data storing pattern DSP may include a magnetic tunnel junction using magnetization directions, a transition metal oxide using an electrical path, or a phase-change material.

A third interlayer insulating layer 150 may be formed to fill a space between the data storing patterns DSP after the formation of the data storing patterns DSP, as described with reference to FIGS. 3, 4A, 4B, and 4C. In example embodiments, the third interlayer insulating layer 150 may expose top surfaces of the data storing patterns DSP, and bit lines BL extending in the first direction D1 may be formed on the third interlayer insulating layer 150.

The semiconductor memory devices described above may be encapsulated using various packaging techniques. For example, the semiconductor memory devices according to the aforementioned embodiments may be encapsulated using any one of a package-on-package (PoP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

Figure 20:
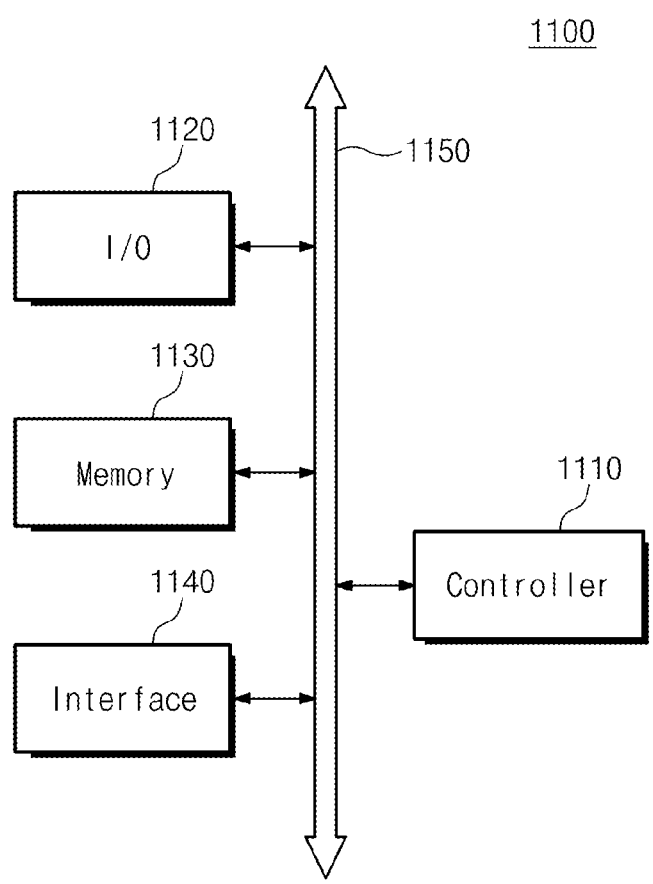
FIG. 20 is a schematic block diagram illustrating an example of an electronic system including a semiconductor memory device according to example embodiments of inventive concepts.

FIG. 20 is a schematic block diagram illustrating an example of an electronic system including a semiconductor memory device according to example embodiments of inventive concepts.

Referring to FIG. 20, an electronic system 1100 according to example embodiments of inventive concepts may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted. The controller 1110, the I/O unit 1120, the memory device 1130, and/or the interface unit 114 may include at least one of the semiconductor memory devices according to the example embodiments of inventive concepts.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or a cable. For example, the interface unit 1140 may include an antenna or a wireless/cable transceiver. Although not shown in the drawings, the electronic system 1100 may further include a fast dynamic random access memory (DRAM) device and/or a fast static random access memory (SRAM) device which acts as a working memory device for improving an operation of the controller 1110.

The electronic system 1100 may be applied to a personal digital assistant (PDA), a portable computer, a web tablet, a wireless phone, a mobile phone, a digital music player, a memory card, or other electronic products. The other electronic products may receive and/or transmit information data by wireless.

Figure 21:
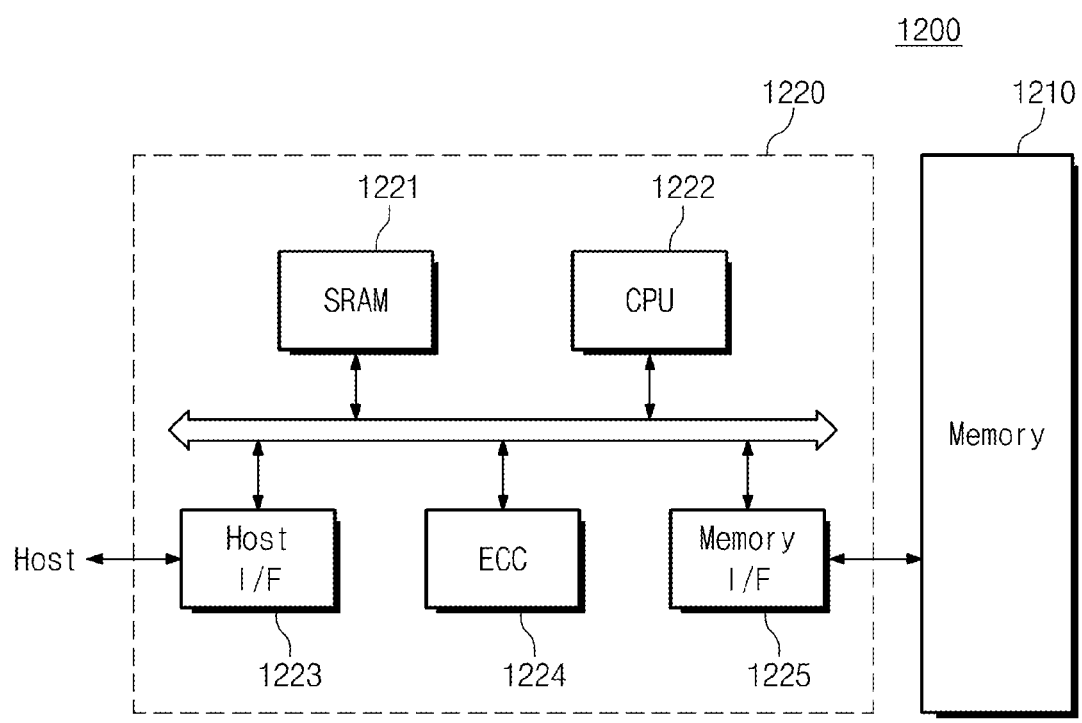
FIG. 21 is a schematic block diagram illustrating an example of a memory card implemented with a semiconductor memory device according to example embodiments of inventive concepts.

FIG. 21 is a schematic block diagram illustrating an example of a memory card implemented with a semiconductor memory device according to example embodiments of inventive concepts.

Referring to FIG. 21, a memory card 1200 includes a memory device 1210. The memory device 1210 may include at least one of the semiconductor memory devices according to the embodiments mentioned above. In addition, the memory device 1210 may further include another type of semiconductor memory devices which are different from the semiconductor memory devices according to the embodiments described above. For example, the memory device 1210 may further include a DRAM device and/or a SRAM device. The memory card 1200 may include a memory controller 1220 that controls data communication between a host and the memory device 1210. In example embodiments, the controller 1220 may include at least one of the semiconductor memory devices according to the aforementioned embodiments.

The memory controller 1220 may include a central processing unit (CPU) 1222 that controls overall operations of the memory card 1200. In addition, the memory controller 1220 may include an SRAM device 1221 used as a working memory device of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. Furthermore, the memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may be realized as solid state disks (SSD) which are used as hard disks of computer systems.

Figure 22:
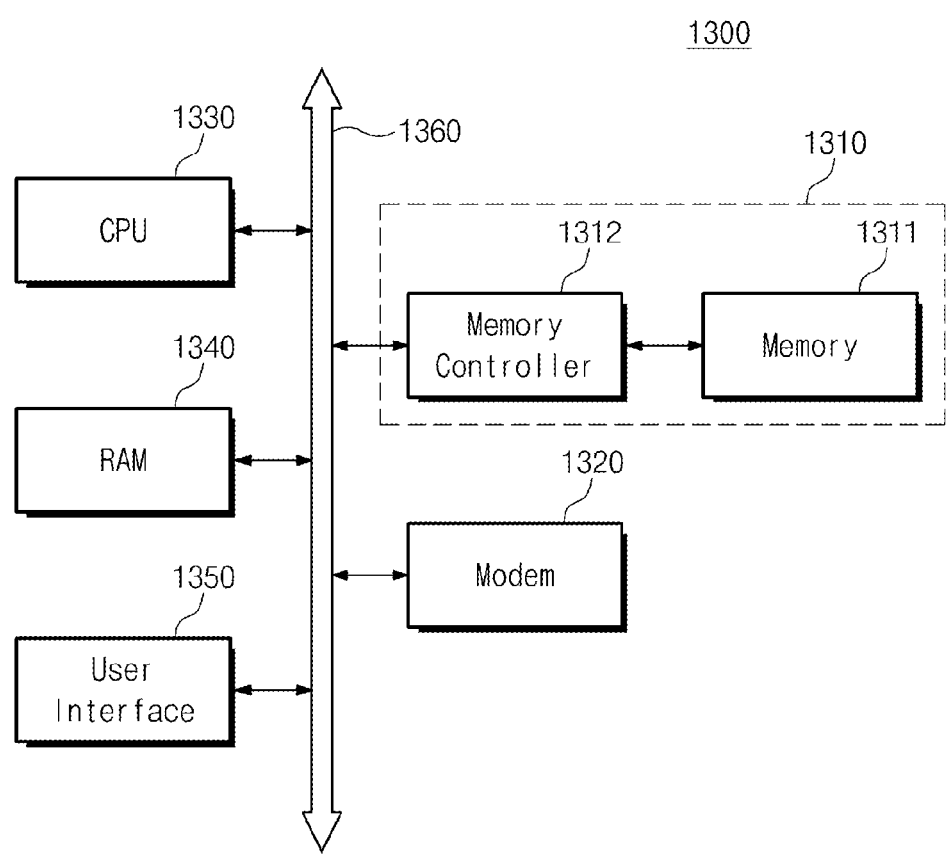
FIG. 22 is a schematic block diagram illustrating an example of an information processing system implemented with a semiconductor memory device according to example embodiments of inventive concepts.

FIG. 22 is a schematic block diagram illustrating an example of an information processing system implemented with a semiconductor memory device according to example embodiments of inventive concepts.

Referring to FIG. 22, a memory system 1310 may be implemented with at least one of the semiconductor memory devices according to the aforementioned embodiments. The memory system 1310 may be installed in an information processing system 1300 such as a mobile device or a desk top computer. The information processing system 1300 according to example embodiments of inventive concepts may include a modem 1320, a central processing unit (CPU) 1330, a random access memory (RAM) 1340, and a user interface unit 1350 that are electrically connected to the memory system 1310 through a system bus 1360. The memory system 1310 may have substantially the same structure as the memory card 1200 described with reference to FIG. 21. In other words, the memory system 1310 may include a memory device 1311 and a memory controller 1312 controlling overall operations of the memory device 1311. The memory system 1310 may store data processed by the CPU 1330 or data inputted from an external system. In example embodiments, the memory system 1310 may be realized as a solid state disk (SSD). In this case, the information processing system 1300 may stably store massive data into the memory system 1310. In addition, as reliability of the memory system 1310 increases, the memory system 1310 may reduce a resource consumed for correcting errors. Thus, the information processing system 1300 may perform a fast data exchange function. Even though not shown in the drawings, the information processing system 1300 may further include an application chipset, a camera image processor (CIS), and/or an input/output (I/O) unit.

In the semiconductor memory device according to example embodiments of inventive concepts, one selection transistor may be realized at each of the active patterns two-dimensionally arranged, and each of the active patterns may have the long axis parallel to the bit lines and source lines. Thus, the active patterns may be easily formed.

Since the one selection transistor is realized at each of the active patterns, one memory cell may be selected by selecting one word line and one bit line and the selected memory cell can be electrically separated from unselected memory cells. In other words, it is possible to limit and/or prevent a current flow between the selected memory cell and the unselected memory cells adjacent thereto when the semiconductor memory device is operated. Thus, write and read failures may be limited and/or prevented during the operation of the semiconductor memory device.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A semiconductor memory device comprising:
   a semiconductor substrate including a trench that defines first, second and third active patterns spaced apart from each other,
   each of the first, second and third active patterns having a long axis parallel to a first direction that is perpendicular to a second direction,
   each of the first, second, and third active patterns including first and second dopant regions,
   the first and second active patterns arranged to be spaced apart from each other in the second direction,
   the third active pattern arranged to be spaced apart from the first and second active patterns in a direction diagonal to the first and second directions;
   a device isolation layer in the trench, the device isolation layer exposing the first, second, and third active patterns;
   a first word line extending in the second direction, the first word line intersecting the first and second active patterns, the first and second dopant regions in each of the first and second active patterns being at both sides of the first word line respectively;
   a second word line extending in the second direction, the second word line intersecting the third active pattern, the first and second dopant regions formed in the third active pattern being at both sides of the second word line;
   a bit line extending in the first direction between the first active pattern and the third active pattern when viewed from a plan view, the bit line being connected to the first dopant regions of the first and third active patterns; and
   a source line extending in the first direction between the second active pattern and the third active pattern when viewed from the plan view, the source line being connected to the second dopant regions of the second and third active patterns.

2. The semiconductor memory device of claim 1, wherein the first word line is spaced apart from the third active pattern, and the second word line is spaced apart from the first and second active patterns.

3. The semiconductor memory device of claim 1, wherein a height at which the bit line is disposed from the semiconductor substrate is different from a height at which the source line is disposed from the semiconductor substrate.

4. The semiconductor memory device of claim 1, further comprising:
   a first conductive pad is in contact with a portion of each of the first dopant regions; and
   a second conductive pad in contact with a portion of each of the second dopant regions, wherein
   the first and second conductive pads connected to the third active pattern are arranged in a first diagonal direction that is different from a second diagonal direction with respect to the long axis of the first active pattern, and
   the first and second conductive pads connected to the first active pattern are arranged in the second diagonal direction.

5. The semiconductor memory device of claim 4, wherein a top surface of the device isolation layer between the first and second conductive pads is lower than bottom surfaces of the first and second conductive pads.

6. The semiconductor memory device of claim 4, wherein the first and second conductive pads contact portions of the device isolation layer, respectively.

7. The semiconductor memory device of claim 4, wherein the source line is in direct contact with portions of the second conductive pads arranged along the first direction.

8. The semiconductor memory device of claim 4, further comprising:
   contact plugs connected to the first conductive pads, respectively; and
   data storing patterns connected between the bit line and the contact plugs.

9. The semiconductor memory device of claim 1, further comprising:
   contact plugs connected to the first dopant regions, respectively; and
   conductive pads that contact portions of the second dopant regions, respectively,
   wherein the source line is connected in common to the conductive pads on the second and third active patterns.

10. The semiconductor memory device of claim 1, further comprising:
    contact plugs connected to the first dopant regions, respectively; and
    a connection pad on the second dopant regions of the second and third active patterns, wherein the second dopant regions of the second and third active patterns are adjacent to each other in the second direction.

11. The semiconductor memory device of claim 10, wherein the source line is in direct contact with a portion of the connection pad between the second and third active patterns.

12. A semiconductor memory device comprising:
    a semiconductor substrate including a trench, the trench defining an active pattern having a long axis parallel to a first direction;
    a device isolation layer in the trench;
    a word line extending in a second direction that is perpendicular to the first direction, the word line intersecting the active pattern;

a first conductive pad at a side of the word line, the first conductive pad being in contact with a portion of the active pattern;

a second conductive pad at another side of the word line, the second conductive pad being in contact with another portion of the active pattern;

a first conductive line extending in the first direction, the first conductive line being connected to the first conductive pad; and a second conductive line extending in the first direction, the second conductive line being connected to the second conductive pad, the active pattern being between the first conductive line and the second conductive line when viewed from a plan view, wherein the second conductive line is spaced apart from the first conductive line in the second direction when viewed from the plan view.

13. The semiconductor memory device of claim 12, wherein the first and second conductive pads are arranged in a direction diagonal to the first and second directions when viewed from the plan view.

14. The semiconductor memory device of claim 12, wherein a height of the first conductive line over the substrate is different than a height of the second conductive line over the substrate.

15. The semiconductor memory device of claim 12, further comprising:
 a contact plug connected to the first conductive pad; and
 a data storing pattern connected between the contact plug and the first conductive line.

16. The semiconductor memory device of claim 12, further comprising:
 a plurality of source lines and a plurality of bit lines on the substrate;
 a plurality of data storage elements on the substrate; and
 first word lines and second word lines extending in the second direction on the substrate, wherein
 the trench defines a plurality of first active patterns and a plurality of second active patterns spaced apart from each other and arranged in rows and columns,
 the plurality of first active patterns include the active pattern,
 the columns of first active patterns alternate with the columns of the second active patterns in a first direction, the rows of first active patterns alternating with the rows of second active patterns in a second direction that crosses the first direction,
 the device isolation layer exposes the plurality of first active patterns and the plurality of second active patterns,
 the plurality of source lines and the plurality of bit lines extend in the first direction on the substrate,
 the plurality of source lines and the plurality of bit lines alternate with each other in the second direction and are spaced apart from each other,
 the plurality of data storage elements are electrically connected between the bit lines and the substrate,
 the data storage elements include a first row of data storage elements and a second row of data storage elements that are adjacent to each other and electrically connected to a same one of the bit lines,
 the data storage elements in the first row of data storage elements are connected between the same one of the bit lines and the first active patterns in one of the rows of first active patterns,
 the data storage elements in the second row of data storage elements are connected between the same one of the bit lines and the second active patterns in one of the rows of active patterns; and
 the first and second word lines alternate with each other in the first direction and spaced apart from each other, the first word lines intersect at least one of the first active patterns and the second active patterns in the plan view, and
 the second word lines intersect at least one of the first active patterns and the second active patterns in the plan view.

17. The semiconductor memory device of claim 16, further comprising:
 a plurality of first conductive pads and a plurality of second conductive pads, wherein
 the plurality of first active patterns and the plurality of second active patterns have a long axis parallel to the first direction,
 the plurality of first active patterns and the plurality of second active patterns each include first and second dopant regions,
 each of the first conductive pads is electrically connected to a corresponding one of the data storage elements and one of the first dopant regions of a corresponding one of the first and second active patterns, and
 the second conductive pads are between the source lines and the second dopant regions of the first and second active patterns.

18. The semiconductor memory device of claim 16, further comprising:
 a plurality of conductive plugs, wherein
 the plurality of first active patterns and the plurality of second active patterns each include first and second dopant regions, and
 each one of the conductive plugs directly connects a corresponding one of the data storage elements to a corresponding one of the first dopant regions of one of the first and second active patterns.

19. The semiconductor memory device of claim 16, further comprising: a plurality of first connection pads, wherein
 each of the first word lines extends between two of the second active patterns that are adjacent to each other in the first direction,
 each of the second word lines extends between two of the first active patterns that are adjacent to each other in the first direction,
 the plurality of first active patterns and the plurality of second active patterns each include first and second dopant regions, and
 each of the first connection pads electrically connects a corresponding one of the source lines to the first dopant region of a corresponding one of the second active patterns and the second dopant region of a corresponding one of the first active patterns.

20. The semiconductor memory device of claim 16, wherein
 the first word lines intersect both the first active patterns and the second active patterns in the plan view, and
 the second word lines intersect both the first active patterns and the second active patterns in the plan view.

* * * * *